(12) United States Patent
Hara et al.

(10) Patent No.: US 9,847,135 B2
(45) Date of Patent: Dec. 19, 2017

(54) MEMORY DEVICE AND METHOD OF READING DATA

(71) Applicant: Toshiba Memory Corporation, Minato-ku (JP)

(72) Inventors: Tokumasa Hara, Kawasaki (JP); Hitoshi Iwai, Kamakura (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/635,329

(22) Filed: Mar. 2, 2015

(65) Prior Publication Data

US 2016/0225457 A1 Aug. 4, 2016

Related U.S. Application Data

(60) Provisional application No. 62/110,013, filed on Jan. 30, 2015.

(51) Int. Cl.
  *G11C 16/26* (2006.01)
  *G11C 16/04* (2006.01)
  (Continued)

(52) U.S. Cl.
  CPC .......... *G11C 16/26* (2013.01); *G11C 11/5642* (2013.01); *G11C 16/0483* (2013.01); *G11C 16/3427* (2013.01)

(58) Field of Classification Search
  CPC . G11C 16/26; G11C 11/5642; G11C 16/0483; G11C 16/3427
  (Continued)

(56) References Cited

U.S. PATENT DOCUMENTS

| 7,379,333 B2* | 5/2008 | Lee | G11C 16/26 365/185.12 |
| 7,876,611 B2* | 1/2011 | Dutta | G11C 11/5642 365/185.02 |

(Continued)

FOREIGN PATENT DOCUMENTS

JP  2009-070501 A  4/2009

OTHER PUBLICATIONS

M. H. White et. al ("On the go with SONOS", Jul. 2000, IEEE Circuits and Devices Magazine, vol. 16, Issue: 4 ).*

(Continued)

*Primary Examiner* — Anthan Tran
*Assistant Examiner* — Mushfique Siddique
(74) *Attorney, Agent, or Firm* — Oblon, McClelland, Maier & Neustadt, L.L.P.

(57) ABSTRACT

A memory device of an embodiment includes a memory cell array and a controller. In the memory cell, data is written per page unit and is erased per block which is a multiple the page unit of a natural number of two or more. The block includes memory strings, each including memory cells capable of storing data of one or more bits with a threshold voltage indicative of an erase state in which data is erased and one or more threshold voltages which are higher than the voltage indicative of the erase state and indicate written states in which data is written. The controller selects one of adjustment values of positive and negative values based on data read from a first memory cell of the memory cells, and reads data from a second memory cell of the memory cells using the selected adjustment value and a first read voltage.

20 Claims, 24 Drawing Sheets

(51) Int. Cl.
*G11C 11/56* (2006.01)
*G11C 16/34* (2006.01)
(58) Field of Classification Search
USPC .................................................. 365/185.12
See application file for complete search history.

(56) References Cited

U.S. PATENT DOCUMENTS

| | | | | |
|---|---|---|---|---|
| 8,670,285 | B2* | 3/2014 | Dong | G11C 11/5642 |
| | | | | 365/206 |
| 9,236,393 | B1* | 1/2016 | Cernea | H01L 27/11551 |
| 9,613,713 | B2* | 4/2017 | Shirakawa | G11C 16/3459 |
| 2005/0162913 | A1* | 7/2005 | Chen | G11C 11/5642 |
| | | | | 365/185.18 |
| 2007/0153583 | A1* | 7/2007 | Guterman | G11C 16/3427 |
| | | | | 365/185.23 |
| 2008/0158973 | A1* | 7/2008 | Mui | G11C 7/1006 |
| | | | | 365/185.18 |
| 2009/0073763 | A1 | 3/2009 | Hosono | |
| 2010/0329036 | A1 | 12/2010 | Park | |
| 2011/0038205 | A1 | 2/2011 | Chou et al. | |
| 2011/0134697 | A1* | 6/2011 | Zhao | G11C 11/5642 |
| | | | | 365/185.12 |
| 2011/0267884 | A1* | 11/2011 | Abiko | G11C 11/5628 |
| | | | | 365/185.08 |
| 2012/0213004 | A1* | 8/2012 | Yun | G11C 11/5642 |
| | | | | 365/185.11 |
| 2014/0063941 | A1* | 3/2014 | Hara | G11C 16/3454 |
| | | | | 365/185.03 |
| 2014/0369127 | A1* | 12/2014 | Hara | G11C 16/0408 |
| | | | | 365/185.17 |
| 2015/0071008 | A1* | 3/2015 | Yang | G11C 16/26 |
| | | | | 365/185.23 |
| 2016/0049192 | A1* | 2/2016 | Lee | G11C 16/3427 |
| | | | | 365/185.03 |
| 2016/0071601 | A1* | 3/2016 | Shirakawa | G11C 16/08 |
| | | | | 711/122 |
| 2016/0078948 | A1* | 3/2016 | Shirakawa | G11C 16/10 |
| | | | | 365/185.12 |
| 2016/0078954 | A1* | 3/2016 | Shirakawa | G11C 16/26 |
| | | | | 365/185.11 |
| 2016/0240262 | A1* | 8/2016 | Shah | G11C 16/34 |
| 2016/0300621 | A1* | 10/2016 | Abe | G11C 11/5628 |
| 2017/0069393 | A1* | 3/2017 | Ueno | G11C 16/26 |

OTHER PUBLICATIONS

Ryota Katsumata et. al ("Pipe-shaped BiCS Flash Memory with 16 Stacked Layers and Multi-Level-Cell Operation for Ultra High Density Storage Devices", 2009, 2009 Symposium on VLSI Technology Digest of Technical Papers).*

Betty Prince ("Vertical 3D Memory Technologies", Chapter Four, 2014 Edition, 2014 John Wiley and Sons Ltd, 2014).*

* cited by examiner

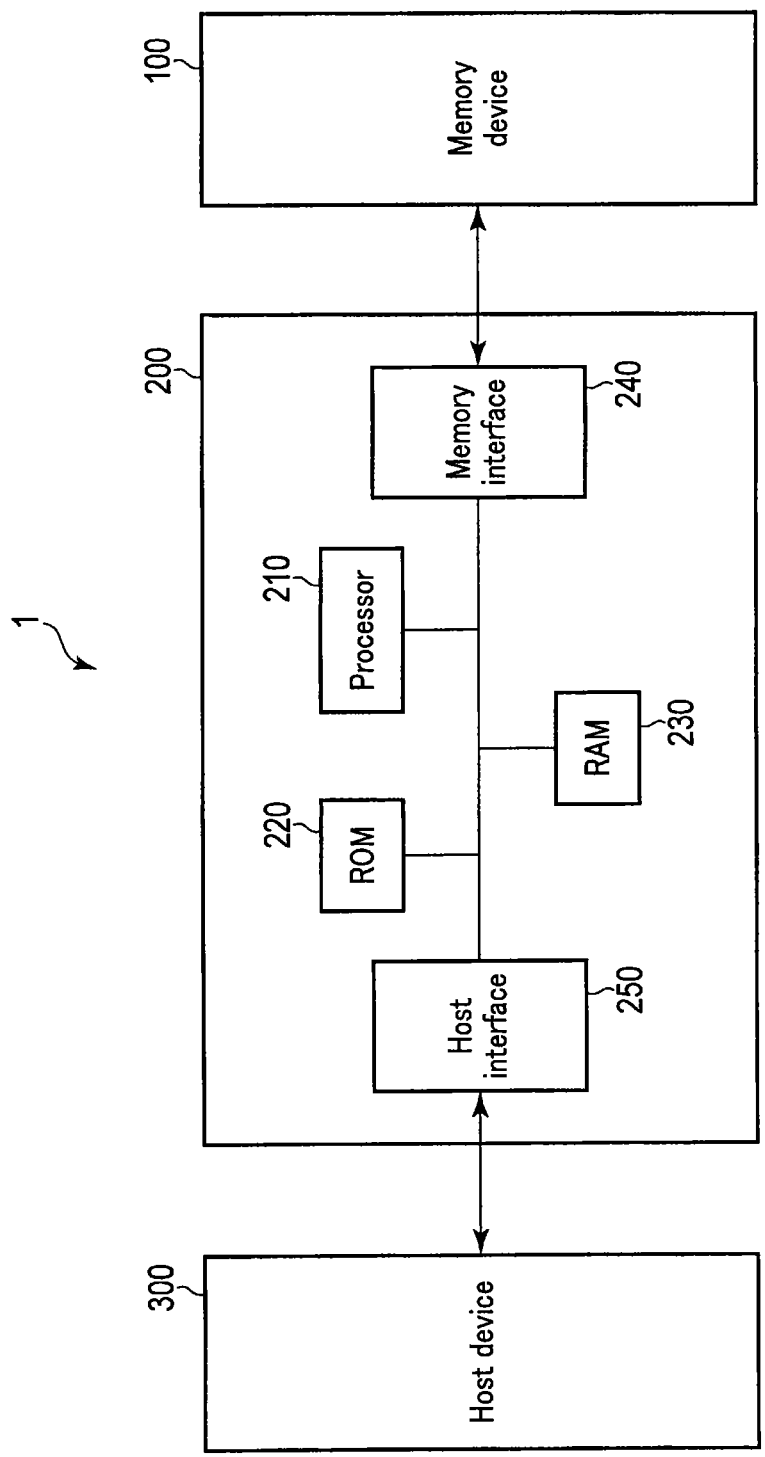
F I G. 1

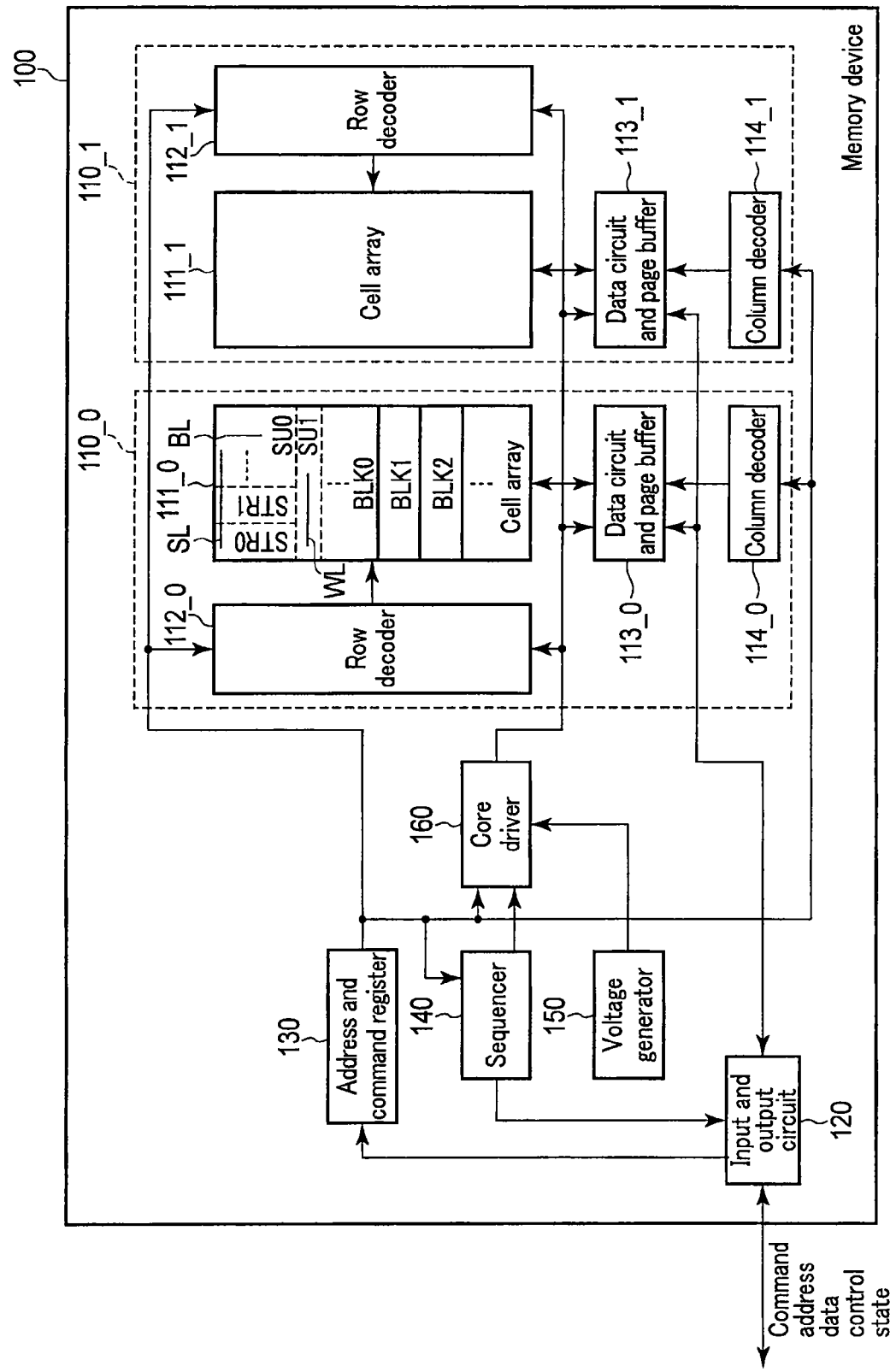
F I G. 2

| Cell set | Read voltage | Data | | | | | | | | |
|---|---|---|---|---|---|---|---|---|---|---|
| CSx+1 | VC | 1 | 1 | 1 | 1 | 0 | 0 | 0 | 0 | 0 |
| CSx | VB | 1 | 1 | 0 | 0 | 1 | 0 | 0 | 0 | |
| | VB+Δ | 1 | 0 | 1 | 0 | 1 | 1 | 0 | 1 | 0 |
| CSx read data | | 1 | 1 | 0 | 0 | 1 | 1 | 0 | 1 | |

CSx+1 data = "1"
CSx+1 data = "0"

F I G. 8

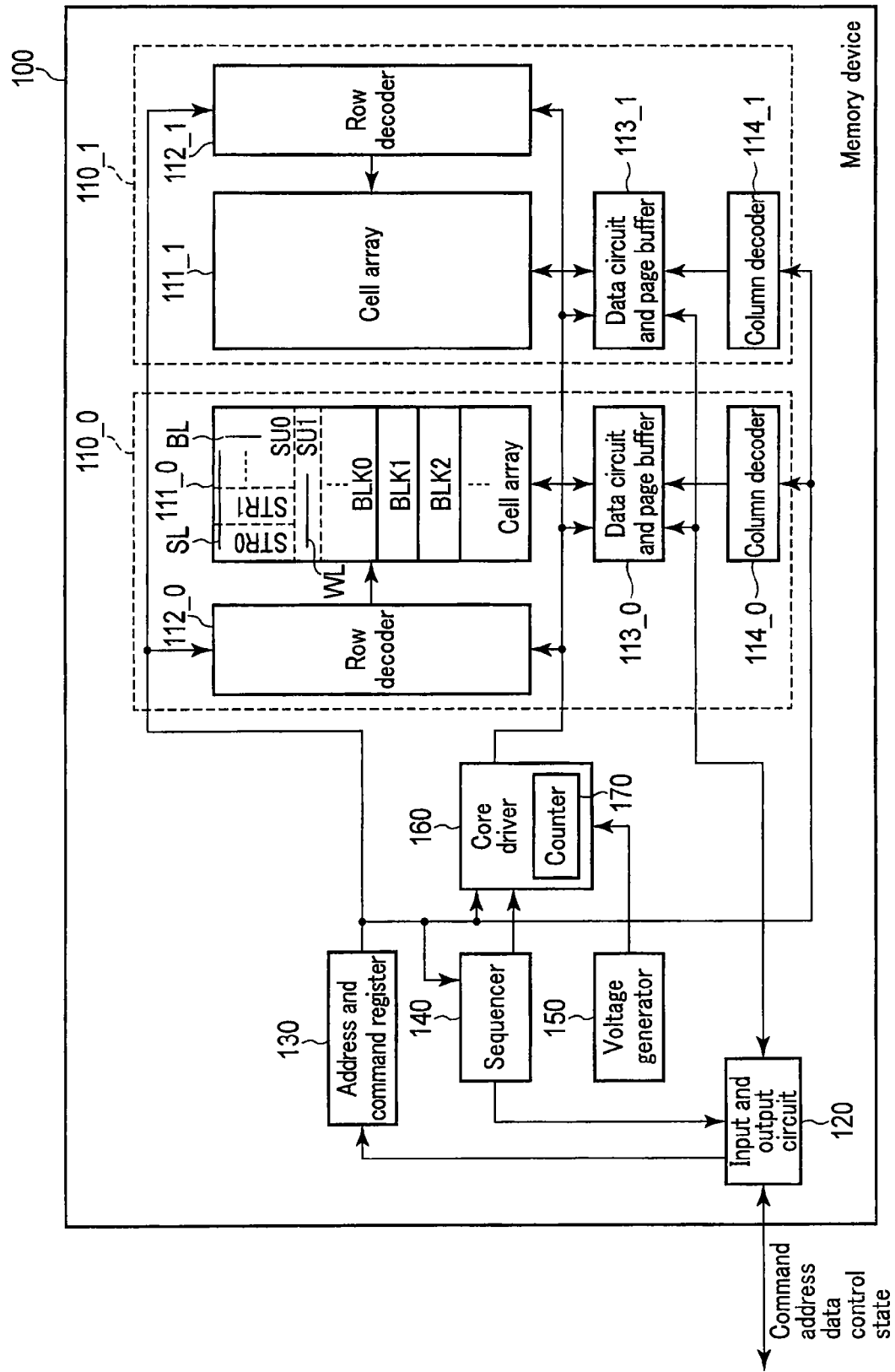
F I G. 10

| Threshold state of adjacent cell set | | | Read voltage adjustment value for read target cell set | | |
|---|---|---|---|---|---|
| Adjacent threshold state | CSx+1 | CSx−1 | Lower page | Upper page | |
| | | | B level read voltage adjustment value | A level read voltage adjustment value | C level read voltage adjustment value |
| 1 | C | C | ΔB1 | ΔA1 | ΔC1 |
| 2 | C | B | ΔB2 | ΔA2 | ΔC2 |
| | B | C | | | |
| 3 | C | A | ΔB3 | ΔA3 | ΔC3 |
| | A | C | | | |
| 4 | C | Er | ΔB4 | ΔA4 | ΔC4 |
| | Er | C | | | |
| 5 | B | B | ΔB5 | ΔA5 | ΔC5 |
| 6 | B | A | ΔB6 | ΔA6 | ΔC6 |
| | A | B | | | |
| 7 | B | Er | ΔB7 | ΔA7 | ΔC7 |
| | Er | B | | | |
| 8 | A | A | ΔB8 | ΔA8 | ΔC8 |
| 9 | A | Er | ΔB9 | ΔA9 | ΔC9 |
| | Er | A | | | |
| 10 | Er | Er | ΔB10 | ΔA10 | ΔC10 |

F I G. 12

| Read voltage | Data | | | |
|---|---|---|---|---|
| VA | 1 | 0 | 0 | 0 |
| VB | 1 | 1 | 0 | 0 |
| VC | 1 | 1 | 1 | 0 |
| Level | Er | A | B | C |

| Threshold state of adjacent cell set | | | Read voltage adjustment value for read target cell set | | |
|---|---|---|---|---|---|
| | | | Lower page | Upper page | |
| Adjacent threshold state | CSx+1 | CSx−1 | B level read voltage adjustment value | A level read voltage adjustment value | C level read voltage adjustment value |
| 1 | C | C | ΔB1+α | ΔA1+α | ΔC1+α |
| 2 | C | B | ΔB2+α | ΔA2+α | ΔC2+α |
| 3 | B | C | ΔB3+α | ΔA3+α | ΔC3+α |
| 4 | C | A | ΔB4+α | ΔA4+α | ΔC4+α |
| | A | C | | | |
| | C | Er | | | |
| | Er | C | | | |
| 5 | B | B | ΔB5+α | ΔA5+α | ΔC5+α |
| 6 | B | A | ΔB6+α | ΔA6+α | ΔC6+α |
| | A | B | | | |
| 7 | B | Er | ΔB7+α | ΔA7+α | ΔC7+α |
| | Er | B | | | |
| 8 | A | A | ΔB8+α | ΔA8+α | ΔC8+α |
| 9 | A | Er | ΔB9+α | ΔA9+α | ΔC9+α |
| | Er | A | | | |
| 10 | Er | Er | ΔB10+α | ΔA10+α | ΔC10+α |

F I G. 18

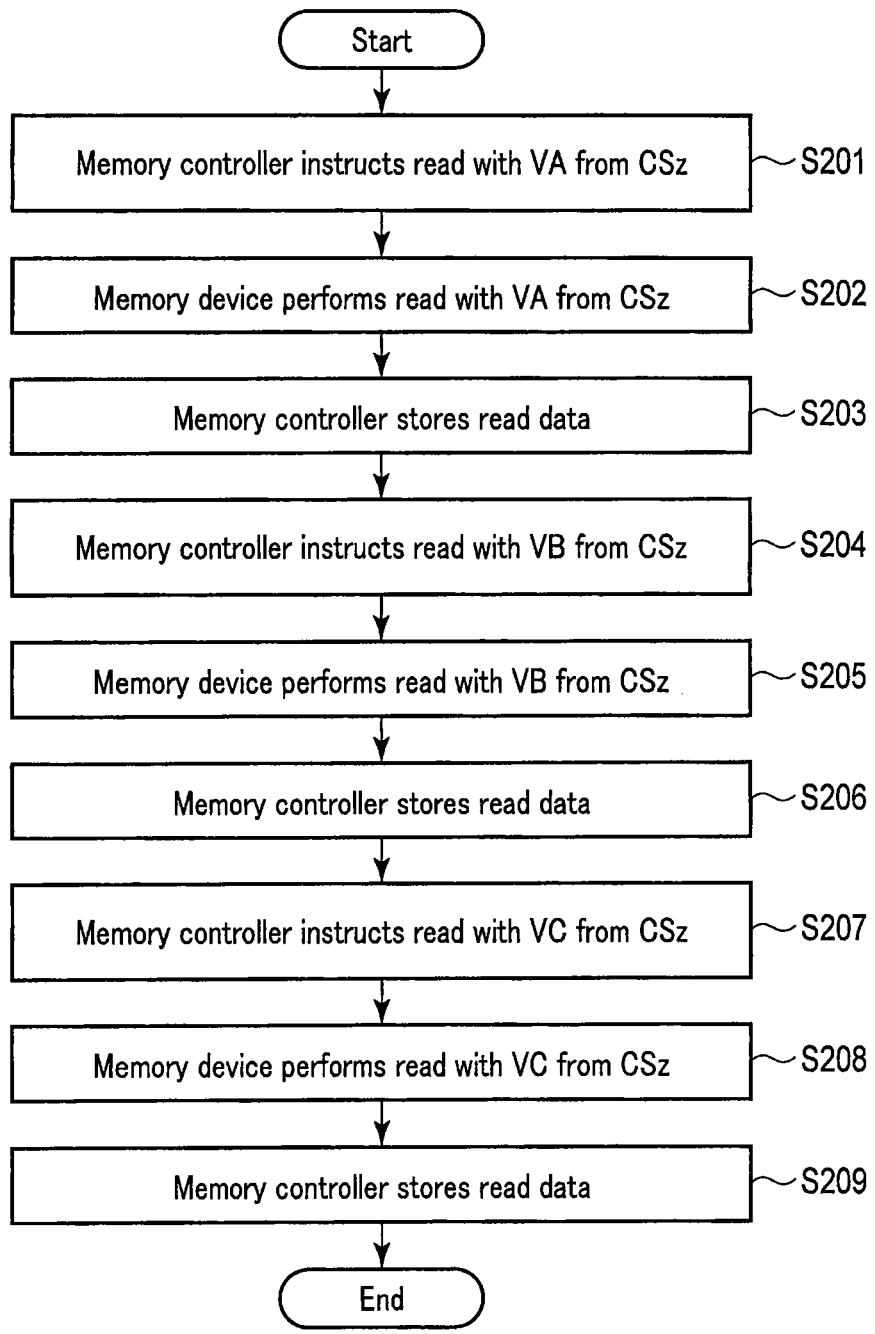
F I G. 21

MEMORY DEVICE AND METHOD OF READING DATA

CROSS-REFERENCE TO RELATED APPLICATIONS

This application claims the benefit of U.S. Provisional Application No. 62/110,013, filed Jan. 30, 2015, the entire contents of which are incorporated herein by reference.

FIELD

Embodiments relate to a memory device and a method of reading data.

BACKGROUND

NAND flash memories with a three-dimensional structure are known.

BRIEF DESCRIPTION OF THE DRAWINGS

FIG. 1 illustrates a block diagram of a memory system of a first embodiment;

FIG. 2 illustrates a block diagram of a memory device of the first embodiment;

FIG. 8 illustrates an example of data obtained as a result of reads in the memory device of the first embodiment;

FIG. 10 illustrates a block diagram of a memory device of the second embodiment;

FIG. 12 illustrates an example of combinations of adjacent threshold states and adjustment values for read voltages in the memory device of the second embodiment;

FIG. 18 illustrates an example of combinations of adjacent threshold states and adjustment values for read voltages in the memory device of the third embodiment;

FIG. 21 illustrates an example of a sub-flow of a read in the memory device of the fourth embodiment;

DETAILED DESCRIPTION

Figure 3:
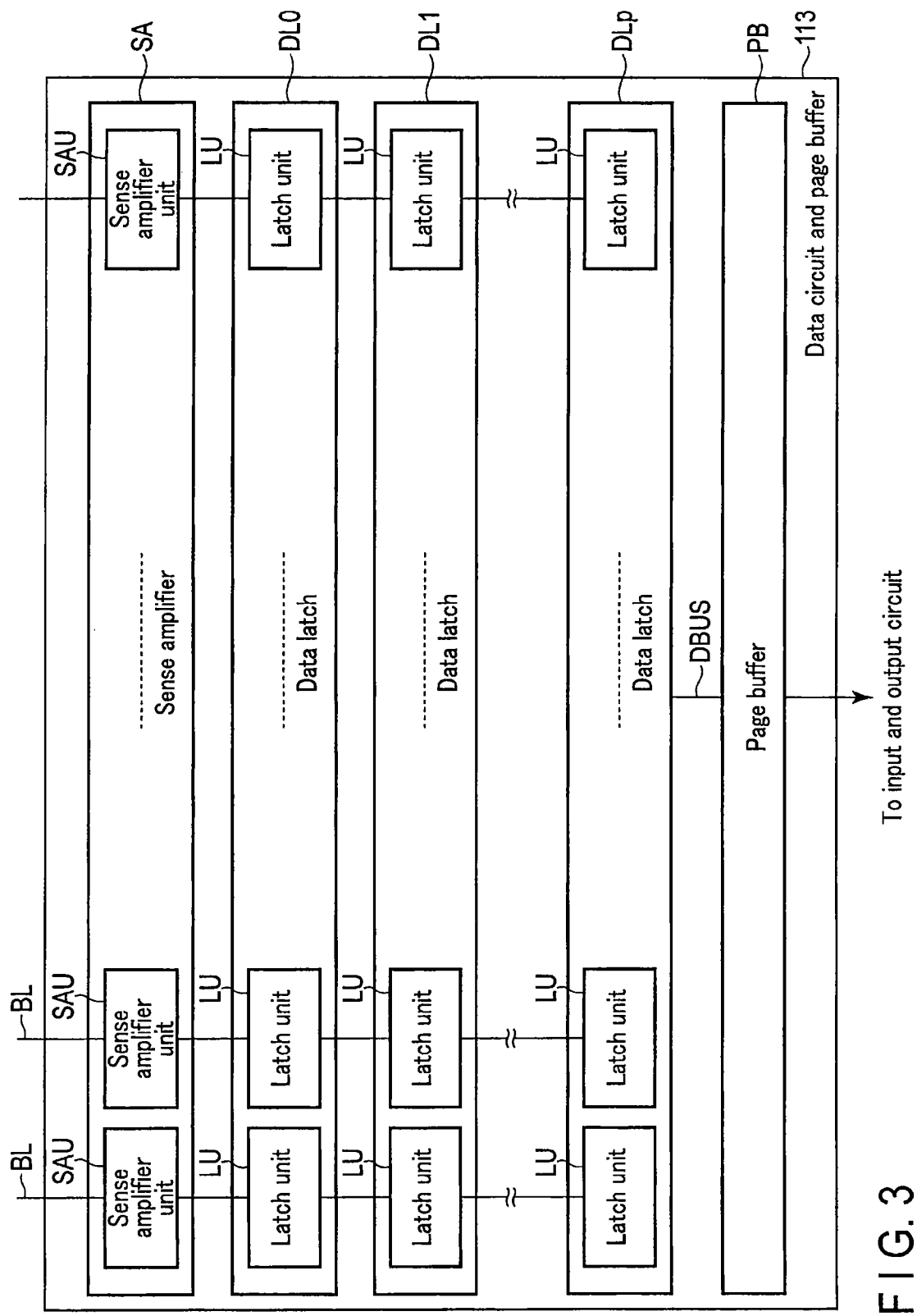
FIG. 3 illustrates a block diagram of a data circuit and page buffer of the first embodiment.

A memory device of an embodiment comprises a memory cell array in which data is written per page unit and data is erased per block which is a multiple of the page unit of a natural number of two or more, the block comprising memory strings, each of the memory strings comprising memory cells capable of storing data of one or more bits with a threshold voltage indicative of an erase state in which data is erased and one or more threshold voltages which are higher than the voltage indicative of the erase state and indicate written states in which data is written; a controller which selects one of adjustment values of positive and negative values based on data read from a first memory cell of the memory cells, and reads data from a second memory cell of the memory cells using the selected adjustment value and a first read voltage.

Some types of nonvolatile semiconductor memory devices store data in a nonvolatile manner based on the amount of electric charge in an insulator of the devices. Electrons are injected into the insulator in order to store data. The insulator into which the electrons are injected is referred to as a charge storage layer, for example. The amount of the electric charge in the charge storage layer is determined not only with the number of the electrons therein but with the number of electron holes as well. The semiconductor memory devices using such a charge storage layer include a three-dimensional-structure type. In the semiconductor memory device with the three-dimensional structure, the charge storage layer is continuous over plural memory cells, and is not separated for each memory cell. For this reason, combination of the electrons and the electron holes may occur on the boundary of the adjacent memory cells in the charge storage layer. This changes the amount of the electric charge in the charge storage layer of adjacent memory cells. The change of the amount of the electric charge progresses over time, and decreases the reliability of data stored by the memory cells.

Embodiments will now be described with reference to figures. In the following description, components with substantially the same functionalities and configurations will be referred to with the same reference numerals, and repeated description may be omitted. Moreover, the description for a particular embodiment is also applicable as a description of another embodiment, unless stated otherwise.

Each functional block can be implemented as hardware, computer software, or a combination of both. For this reason, in order to clearly illustrate this interchangeability of hardware and software, descriptions will be made in terms of their functionality in general. How these functions are implemented depends on various factors.

Each functional block does not necessarily need to be distinguished as in the following examples. For example, some of the functions may be implemented by functional blocks different from those illustrated below. Furthermore, an illustrated functional block may be divided into functional sub-blocks.

First Embodiment

FIG. 1 illustrates a block diagram of a memory system of the first embodiment. A memory system 1 includes a memory device 100, a memory controller 200, and a host device 300 as illustrated in FIG. 1. The memory device 100 stores data in a nonvolatile manner, and has plural memory cells, and is a NAND flash memory, for example.

The memory controller 200 controls the memory device 100. The memory controller 200 receives commands from the host device 300, and controls the memory device 100 based on the received commands, for example. The memory controller 200 includes components, such as a processor 210 such as a central processing unit (CPU), a read only memory (ROM) 220, a random access memory (RAM) 230, a memory interface 240, and a host interface 250.

The memory controller 200 performs various operations when a program stored in the ROM 22 is executed by the processor 210, for example. The RAM 230 stores temporary data, and works as a workspace for the processor 210.

The memory interface 240 is coupled to the memory device 100 via, for example, a bus, such as a NAND bus, and manages communication between the memory controller 200 and the memory device 100. Some of the functions of the memory interface 240 may be implemented by the program executed by the processor 210. The host interface 250 is coupled to the host device 300 via, for example, a bus, such as a controller bus, and manages communication between the memory controller 200 and the host device 300. Some of the functions of the host interface 250 may be implemented by the program executed by the processor 210.

FIG. 2 illustrates a block diagram of the memory device of the first embodiment. The memory device 100 includes components, such as plural planes 110 (110_0, 110_1), an input and output circuit 120, an address and command register 130, a sequencer (controller) 140, a voltage generator 150, and a core driver 160. FIG. 2 illustrates an example of two planes 110_0 and 110_1. The planes 110 include the same components. Each plane 110 includes a cell array 111 (111_0 and 111_1), a row decoder 112 (112_0 and 112_1), a data circuit and page buffer 113 (113_0 and 113_1), and a column decoder 114 (114_0 and 114_$_1$).

The cell array 111 includes plural blocks BLK. Each block BLK includes plural string units (groups) SU (SU0, SU1, . . . ). Each string unit SU includes plural (NAND) strings STR. Each string STR includes plural memory cells. In the cell array 111, components, such as word lines WL, bit lines BL, source lines SL, and select gate lines, are provided.

The input and output circuit 120 is coupled to the memory interface 240 of the memory controller 200 via the controller bus. The input and output circuit 120 controls input and output of signals, such as commands, address signals, data, and control signals to and from the memory controllers 200 (or, memory interface 240). The signals are transmitted on the controller bus. An address signal specifies an address in the cell array 111, and includes a column address and a row address, for example. The column address and the row address specify a row and a column of the cell array 111, respectively. A row address includes a plane address, a block address, a string (or, string unit) address, and a page address. The plane address, the block address, the string address, and the page address specify a plane 110, a block BLK, a string STR (or, string unit SU), and a word line WL, respectively.

The address and command register 130 receives commands and address signals via the input and output circuit 120, and stores them. The sequencer 140 receives commands from the address and command register 130, and controls the voltage generator 150 and the core driver 160 in accordance with the sequence based on the commands. The voltage generator 150 generates various voltages (or, potentials) based on instructions of the sequencer 140.

The core driver 160 operates based on instructions of the sequencer 140, and receives various voltages from the voltage generator 150. The core driver 160 controls the data circuit and page buffer 113 in order to control the bit lines BL. The core driver 160 uses voltages from the voltage generator 150 to generate voltages to be applied to the word lines WL and select gate lines. Specifically, the core driver 160 generates voltages which should be applied to word lines WL specified by a page address and other word lines WL. Moreover, the core driver 160 generates voltages which should be applied to the select gate lines of a string unit SU specified by a string address.

The row decoder 112 receives address signals from the address and command register 130, and receives voltages which should be applied to the word lines WL and the select gate lines from the core driver 160. The row decoder 112 of a plane 110 specified by an address signal transfers voltages from the core driver 160 to the block BLK specified by a block address signal.

The data circuit and page buffer 113 temporarily stores data read from the cell array 111, receives write data from outside the memory device 100, and writes the received data to selected memory cells. The column decoder 114 receives column address signals from the address and command register 130. The column decoder 114 controls input and output of data of the data circuit and page buffer 113 based on the column address signals.

FIG. 3 illustrates a block diagram of the data circuit and page buffer 113. The data circuit and page buffer 113 include sense amplifier SA, data latches DL (DL0 to DLp), and a page buffer PB, where p is a natural number. The sense amplifier SA includes sense amplifier units SAU coupled to respective bit lines BL, reads data of the memory cells via the bit lines BL, and detects the states of the memory cells via the bit lines BL. Each data latch DL includes latch units LU of the same number as that of the bit lines BL, and can store data of the same number of bits as that of the bit lines BL. A set of bits as many as the bit lines BL is referred to as a page. One sense amplifier unit SAU and one latch unit LU in each of all the data latches DL are coupled mutually. The page buffer PB is coupled to a data latch DL by a bus DBUS, and stores data of one page, and is coupled to the input and output circuit 120.

Figure 4:
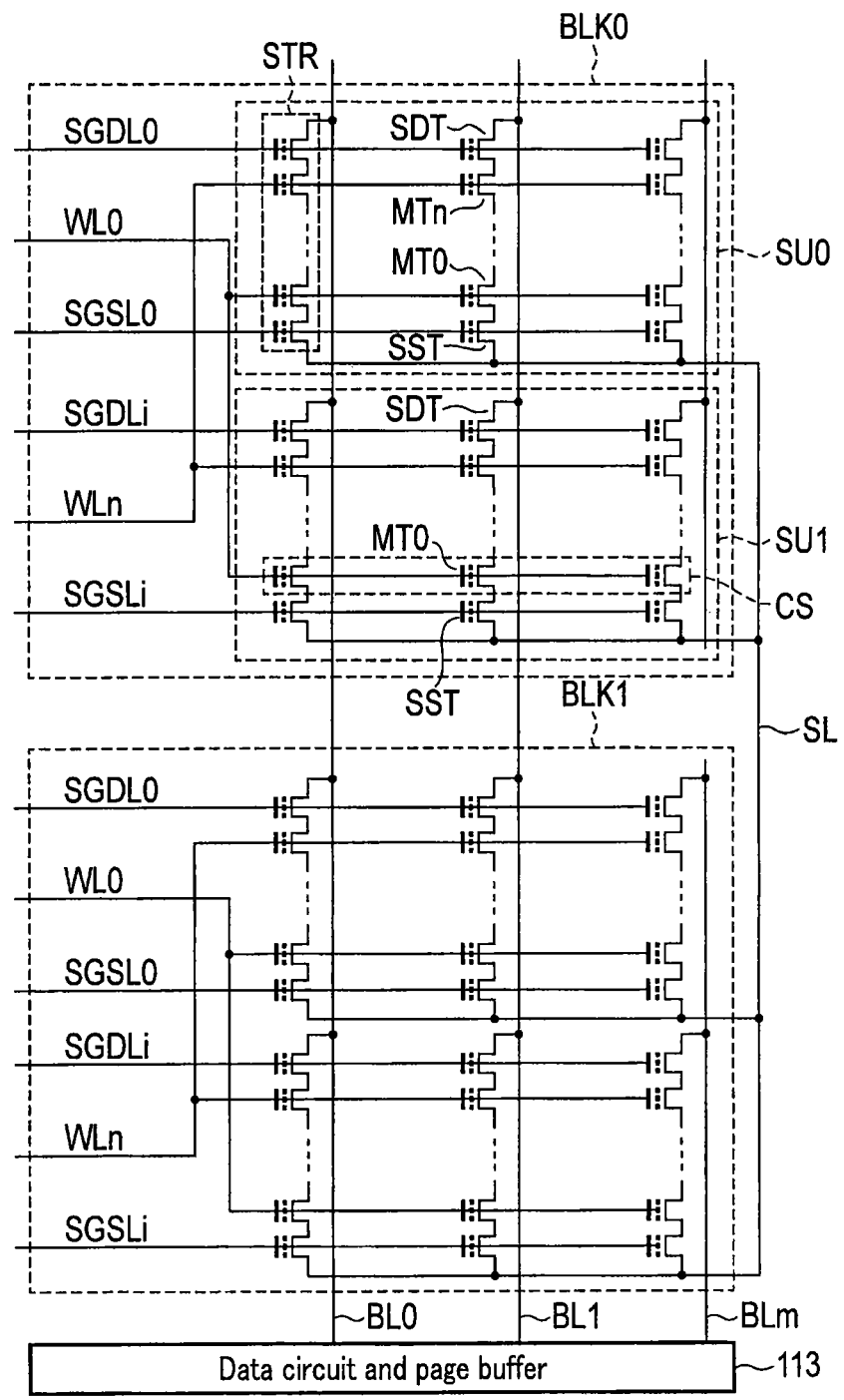
FIG. 4 illustrates a circuit diagram of part of the cell array of the first embodiment.

The cell array 111 has components and connections illustrated in FIG. 4. FIG. 4 is a circuit diagram of part (two blocks BLK0 and BLK1) of the cell array according to the first embodiment. As described above, the cell array 111 includes plural blocks BLK. Each block BLK has the same components and connections, and includes i+1 string units (i being a natural number) SU (SU0 to SUi). Each string unit SU includes plural strings STR. Moreover, the cell array 111 includes m+1 bit lines (m being a natural number) BL (BL0 to BLm) and a source line SL. In each block BLK, i+1 strings STR are coupled to one bit line BL.

One string STR has n+1 cell transistors MT0 to MTn coupled in series, a source side select gate transistor SST, and a drain side select gate transistor SDT. n is a natural number, 47 for example, and the following description is based on the example of n=47. The cell transistors MT serve as memory cells. In each string STR, the drain of the transistor SST is coupled to the source of the cell transistor MT0. The source of the transistor SDT is coupled to the drain of the cell transistor MT47. The source of the transistor SST is coupled to the source line SL. The drain of the transistor SDT is coupled to one corresponding bit line BL.

Strings STR which line up along the word lines WL make one string unit SU. For example, all the strings STR which line up along the word lines WL and are respectively coupled to all the bit lines BL make one string unit SU. In each string unit SU, respective gates of respective cell transistors MTy (y being 0 or a natural number) of the strings STR are commonly coupled to a word line WLy. In each string unit SU, respective gates of respective transistors SDT of the strings STR are commonly coupled to a drain side select gate line SGDL. For string units SU0 to SUi, select gate lines SGDL0 to SGDLi are provided, respectively.

In each string unit SU, respective gates of respective transistors SST of the strings STR are commonly coupled to a source side select gate line SGSL. For string units SU0 to SUi, source side select gate lines SGSL0 to SGSLi are provided, respectively.

The cell transistors MT which are from respective strings STR in one string and are coupled to one word line WL make a cell set CS. The memory space of one cell set CS makes one or plural pages. One page may be formed by a memory space of some cell transistors MT in a cell set CS. Data is read in units of pages. A write may be performed in units of pages or cell sets CS. The memory device 100 can store data of two or more bits in one memory cell. When one memory cell stores two-bit data, one cell set CS stores data for two pages. In this case, plural page addresses are assigned to one cell set CS. When one memory cell stores one-bit data, one cell set CS stores data for one page. By expansion of such a method of storing, data of three or more bits can be stored in one memory cell. The following is based on the example of storing of two-bit data per memory cell. From the address instructed to be accessed, a word line WL to be selected can be specified.

In each block BLK, the word lines WLy of the same identification (address) in different strings STR are coupled mutually.

For access to the cell transistors MT, one block BLK is selected and one string unit SU is selected. In order to select a block BLK, only a block BLK specified by the block address signal is supplied with a signal for selecting a block BLK. With such a block selection signal, in the selected block BLK, the word lines WL and the select gate lines SGSL and SGDL are coupled to drivers in the core driver 160.

Furthermore, in order to select one string unit SU, the select gate transistors SST and SDT only in the selected string unit SU receive voltages for selection. In unselected string units SU, select gate transistors SST and SDT receive voltages for un-selection. The voltages for selection depend on operations, such as a read and a write. Similarly, the voltages for un-selection also depend on operations, such as a read and a write.

Figure 5:
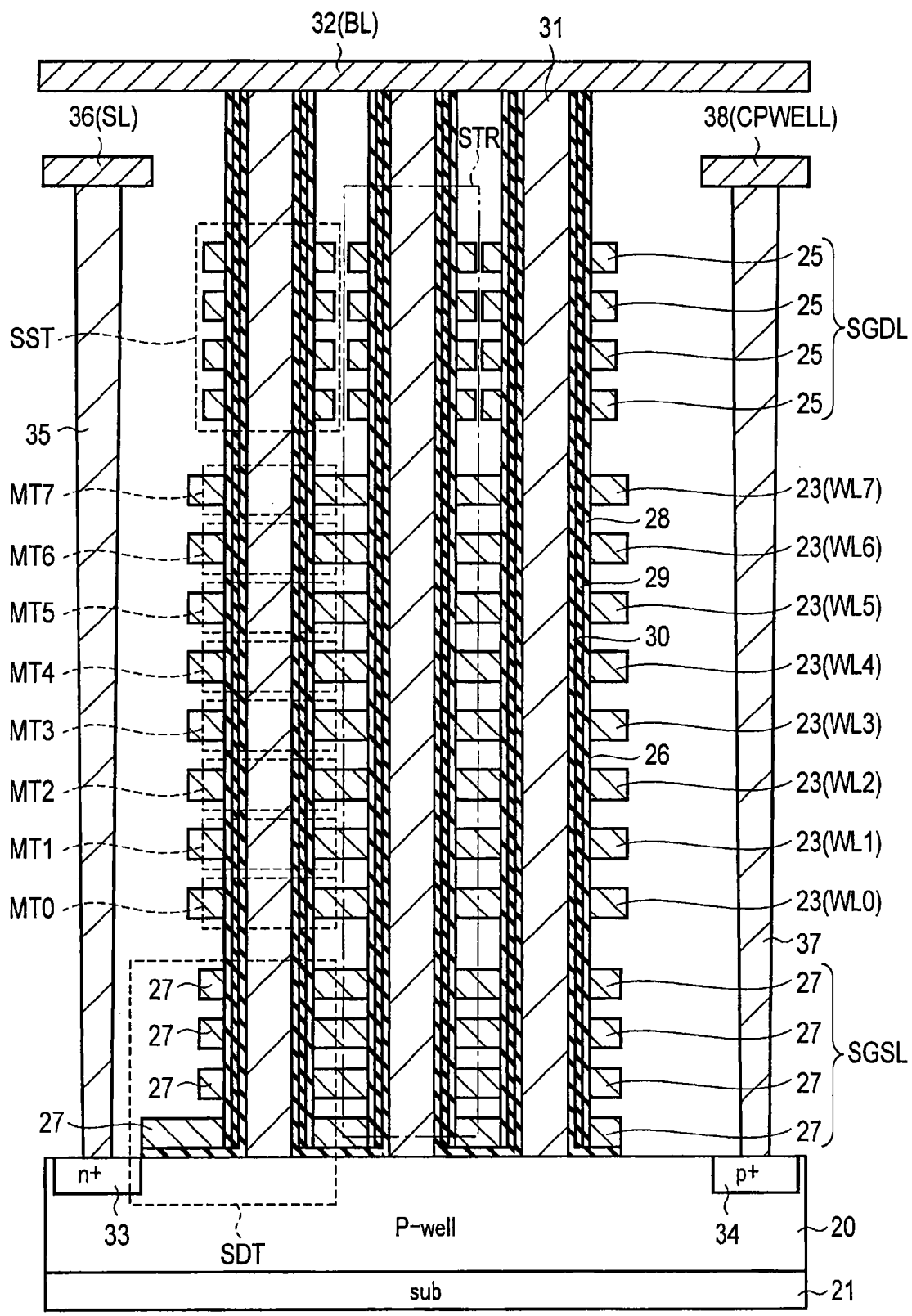
FIG. 5 illustrates a section of part of the cell array of the first embodiment.

The cell array 111 has a structure illustrated, for example, in FIG. 5. FIG. 5 illustrates a section of part of the cell array 111 according to the first embodiment. As illustrated in FIG. 5, a substrate 21 is provided in its surface with a p-type well region 20, on which plural strings STR are provided. Specifically, on the well region 20, interconnect layers 27, interconnect layers 23, and interconnect layers 25 are provided. The interconnect layers 27 serve as a select gate line SGSL. The interconnect layers 23 serve as word lines WL. The interconnect layers 25 serve as a select gate line SGDL.

Through the interconnect layers 25, 23, and 27, sets of a semiconductor (silicon) pillar 31, block insulator 28, charge storage layer (insulator) 29, and gate insulating layer 30 are provided. The semiconductor pillar 31, the block insulator 28, the charge storage layer 29, and the gate insulator 30 are in contact with the well region 20. The block insulator 28, the charge storage layer 29, and the gate insulator 30 have a cylindrical shape. The block insulator 28 covers the side of the semiconductor pillar 31, the charge storage layer 29 covers the side of the block insulator 28, the charge storage layer 29 covers the side of the block insulator 28, and the gate insulator 30 covers the side of the charge storage layer 29. The semiconductor pillar 31 serves as a current path of the string STR, and provides an area in which channels for the cell transistors MT and select gate transistors SST and SDT are formed.

In each string STR, the interconnect layers 27 are electrically coupled mutually. In each string STR, the interconnect layers 25 are also electrically coupled mutually.

Such a structure results in provision of the select gate transistor SST, plural memory cell transistors MT, and select gate transistor SDT on the well region 20 in each string STR. An interconnect layer 32 is formed on the top of the semiconductor pillar 31. The interconnect layer 32 serves as a bit line BL. In the area of the surface of the well region 20, $n^+$-type impurity diffusion layer 33 and $p^+$-type impurity diffusion layer 34 are provided. The diffusion layer 33 is coupled to the bottom of a contact plug 35, whose top is coupled to an interconnect layer 36. The interconnect layer 36 serves as a source line SL. The diffusion layer 34 is coupled to the bottom of a contact plug 37, whose top is coupled to an interconnect layer 38. The interconnect layer 38 serves as a well interconnect CPWELL. The interconnect layers 36 and 38 are located between the interconnect layers 25 and 32. Two or more sets of components shown in FIG. 5 are arranged along the direction which penetrates the paper on which FIG. 5 is depicted. One string unit SU includes such strings STR which line up along the direction which penetrates the paper.

Figure 6:
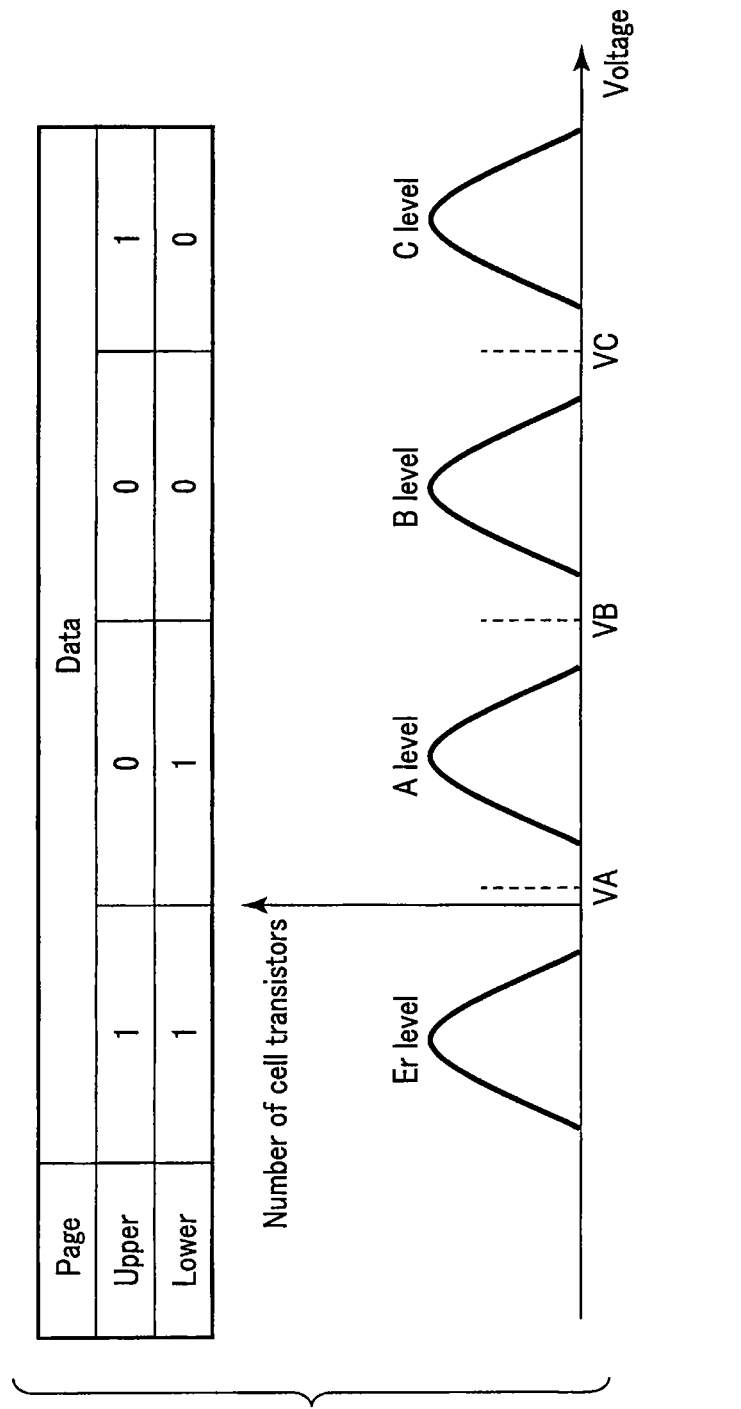
FIG. 6 illustrates an example of a relationship between data stored in cell transistors and threshold voltages of the first embodiment.

Each memory cell can take various threshold voltages based on the data to be stored. The threshold voltages are determined based on the amount of the electric charge of the charge storage layer 29 of the cell transistors MT. The cell transistors MT are injected with electric charge into the charge storage layer 29, and are given threshold voltages based on the data to be stored. FIG. 6 illustrates an example of a relationship between data to be stored in the cell transistors and threshold voltages according to the first embodiment. FIG. 6 and the following description are based on an example of storing of two bits per cell transistor. In a case of storing of two bits per cell transistor, each cell transistor MT can have one of four threshold voltages. The two-bit data assigned to four threshold voltages are "11", "01", "00", and "10" in the order from that with the smallest threshold voltage to the highest one. Even when the cell transistors MT store the same data, they have different threshold voltages due to variation in properties among the cell transistors MT. For this reason, the threshold voltages have distributions as illustrated in FIG. 6.

The cell transistors MT storing "11" data are at an Er level. The memory cell at the Er level is in a state where the electric charges in the charge storage layer 29 are drawn out, and indicates the state with data erased, and may have threshold voltages of positive values as well as negative values as in the FIG. 6 example. The cell transistors MT storing "01", "00", and "10" data are in states with the electric charge injected into the charge storage layer 29. The cell transistors MT storing "01" data are at an A level, and have threshold voltages higher than those at the Er level. The cell transistors MT storing "00" data are at a B level, and have threshold voltages higher than those at the A level. The cell transistors MT storing "10" data are at a C level, and have threshold voltages higher than those at the B level.

The set of the higher bits of the cell transistors MT of one cell set CS is referred to as an upper page, whereas the set of the lower bits is referred to as a lower page. A cell transistor MT which stores "1" data in its lower bit is at the Er or A level. In contrast, a cell transistor MT which stores "0" data in its lower bit is at the B or C level. Similarly, a cell transistor MT which stores "1" data in its higher bit is at the Er or C level. In contrast, a cell transistor MT which stores "0" data in its higher bit is at the A or B level.

The relationship between two-bit data and threshold voltages is not limited to that illustrated in FIG. 6, and can be selected suitably.

For distinction of the data stored in a read-target cell transistor MT, read voltages VA, VB, and VC are used. The read voltages VA, VB, and VC are used in order to determine that the cell transistor MT is at the A, B, and C levels, respectively. The read voltage VB is higher than the read voltage VA, and the read voltage VC is higher than the read voltage VB. Therefore, a cell transistor MT at the Er level has the threshold voltage in the area of smaller than the read voltage VA. A cell transistor MT at the A level has the threshold voltage in the area between the read voltages VA and VB. A cell transistor MT at the B level has the threshold voltage in the area between the read voltages VB and VC. A cell transistor MT at the C level has the threshold voltage in the area of larger than the read voltage VC. Determining the level of a cell transistor MT corresponds to determining the area to which the threshold voltage of that cell transistor MT belongs.

Figure 7:
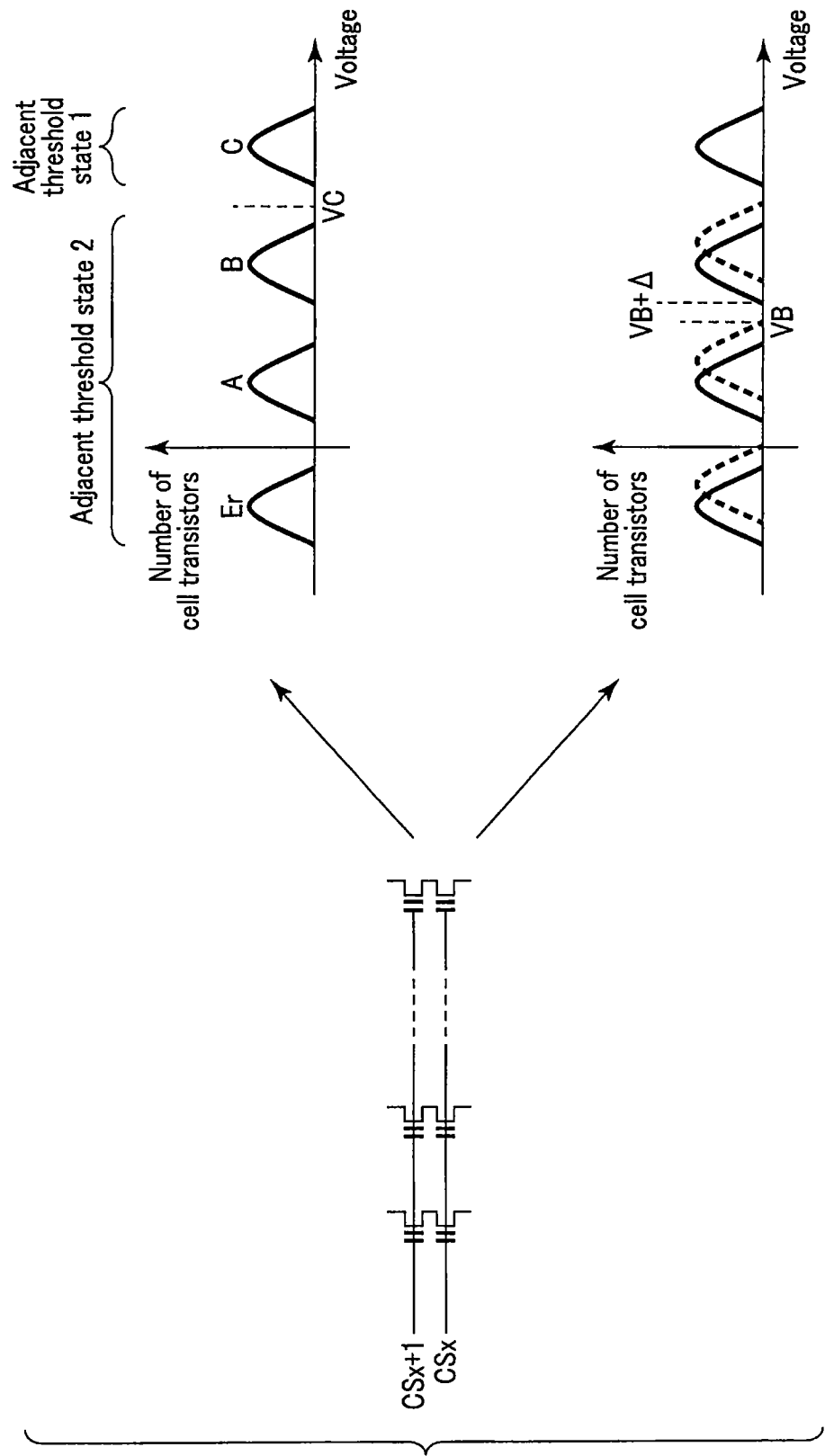
FIG. 7 illustrates an example of distributions of the threshold voltages of the cell transistors in the memory device of the first embodiment.
Figure 9:
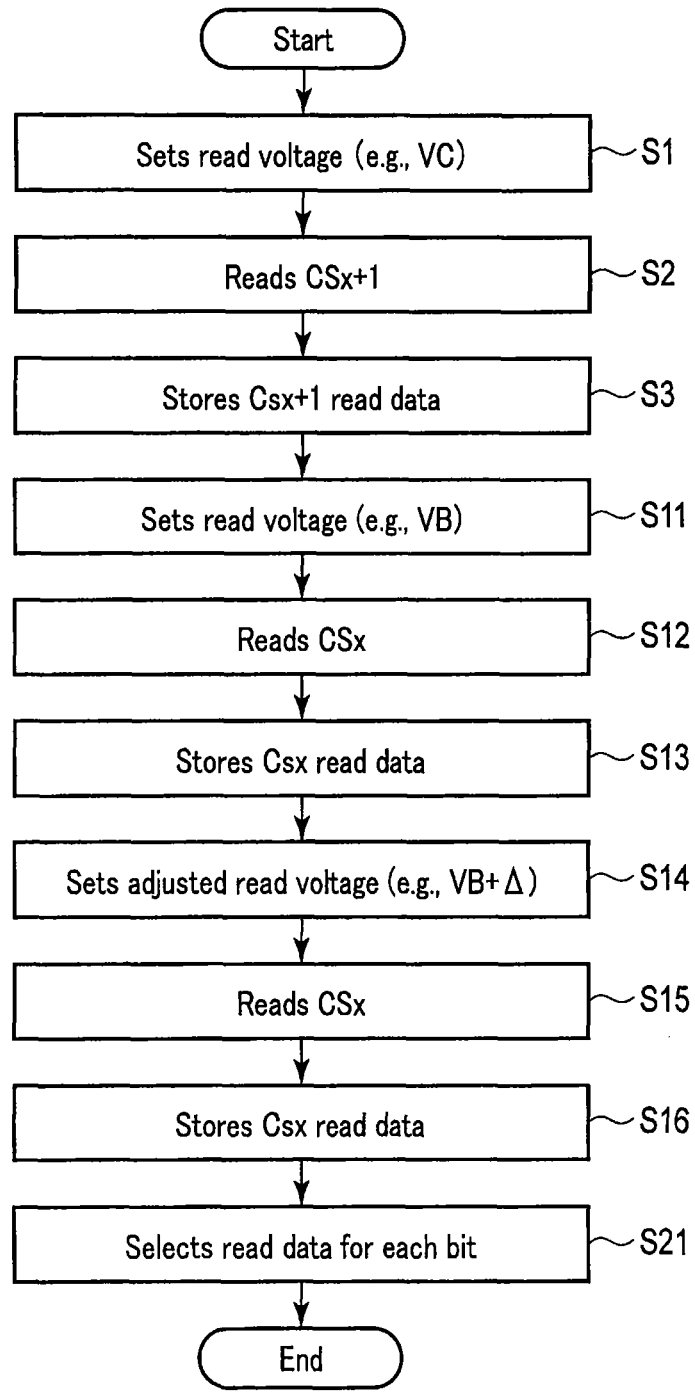
FIG. 9 illustrates the flow of a read in the memory device of the first embodiment.

Referring to FIGS. 7 to 9, a read of data in the memory device 100 of the first embodiment will now be described. The memory device 100, in particular the sequencer 140, is configured to perform the operations described with reference to FIGS. 7 to 9. When the memory device 100 is instructed to perform a read from a particular page, it performs a read described below. As described above, from the address of the read target page, a read target cell set CS and in turn a to-be-selected word line WL are specified by the sequencer 140.

As shown in FIG. 7, when the sequencer 140 is instructed to read from a set of cells CSx coupled to a word line WLx (x being an integer of 1 to n), it determines the state of the threshold voltage of each cell transistor MT of a set of cell CSx+1 coupled to the adjacent word line WLx+1 (or WLx−1). Specifically, the sequencer 140 determines whether each cell transistor MT of the adjacent cell set CSx+1 has a threshold voltage larger than a reference voltage. The voltage for reference used here can be any of the read voltages VA, VB and VC, for example. Particularly, the determination on whether the reference voltage is exceeded corresponds to determination on whether the determination target cell transistors MT is at any of one or more of the Er, A, B, and C levels. A state with a cell transistor MT of the adjacent cell set CSx+1 at any of a particular one or more levels is referred to as an adjacent threshold state 1, and a state with a cell transistor MT at the remaining one or ones of levels at which it can be in the adjacent threshold state 1 is referred to as an adjacent threshold state 2. Note that the adjacent cell set whose adjacent threshold state is determined may be the cell set CSx−1. The following description is based on the example of CSx+1.

The level as a criteria upon determination on whether the cell transistor MT of the target of the determination for its adjacent threshold state is at the adjacent threshold state 1 or 2 can be selected based on how much that cell transistor MT influences change of the threshold voltage of the cell transistor MT of the read target cell set CSx. For example, the largest or smallest level is used, and the C or Er level is used in the current example (or, context). The following description is based on an example of the C level. Therefore, the following description is based on an example where the cell transistor MT is in the adjacent threshold state 1 when it is at the Er, A, or C level, and in the adjacent threshold state 2 when at the C level.

As described above, a cell transistor MT of the largest or smallest level may influence most significantly the threshold voltage of the adjacent cell transistor MT, or the cell transistor MT coupled to an adjacent word line WL. For this reason, when a particular cell transistor MT of the adjacent cell set CSx+1 is at the C level, it may raise the threshold voltage of a cell transistor MT which adjoins that particular cell transistor MT. As a result, distributions of the threshold voltages of Er, A, and B levels of the read target cell set CS shift in the positive direction as shown with broken lines. It is considered or expected that the distribution of the threshold voltage of the C level is free from being influenced.

The shifting of the distributions of the threshold voltages of the read target cell set CS can cause a particular threshold voltage distribution to overlap with an adjacent threshold voltage distribution. If such overlapping occurs, the phenomenon of failure of correct reading of data from the read target cell set CS may occur.

In order to deal with this phenomenon, the memory device 100 determines the threshold state of the adjacent cell set CSx+1 before a read of the cell set CSx. To this end, the sequencer 140 controls the core driver 160, the row decoder 112, the data circuit and page buffer 113, and the column decoder 114, to read data from the adjacent cell set CSx+1 with the read voltage VC. As described above, the read voltage VC is the voltage for determination of the C level. "0" data is read from a cell transistor MT at the C level, and "1" data is read from a cell transistor MT at levels other than the C level.

The data read from the adjacent cell set CSx+1 is stored in a data latch DL which holds no valid data (or, unused data latch DL). Each latch unit LU of the data latch DL stores the data from the bit line BL coupled thereto, i.e., it stores data read from one cell transistor MT included in one cell set CSx+1. Therefore, the data from all the cell transistors MT of the adjacent cell set CSx+1 is stored in one data latch DL. The example as a result of the read is illustrated in the first row of FIG. 8. FIG. 8 illustrates an example of data obtained as a result of the read by the memory device of the first embodiment. FIG. 8 illustrates only the values of eight bits of the cell set CS.

In the FIG. 8 example, as a result of the read from the adjacent cell set CSx+1 with the read voltage VC, the first to fourth bits are "1" and the fifth to eighth bit are "0".

In other words, the cell transistors MT corresponding to the first to fourth bits are not at the C level, and are in the adjacent threshold state 2. In contrast, the cell transistors MT corresponding to the fifth to eighth bits are at the C level, and are in the adjacent threshold state 1.

The sequencer 140 then controls the core driver 160, the row decoder 112, the data circuit and page buffer 113, and the column decoder 114, to read data from the read target cell set CS. The sequencer 140 reads data from the read target cell set CS, using the read voltage VB as an example. This read corresponds to a read of the lower page from the read target cell set CS. The example as a result of the read is illustrated in the second row of FIG. 8.

Furthermore, the sequencer 140 controls the core driver 160, the row decoder 112, the data circuit and page buffer 113, and the column decoder 114, to read data from the read target cell set CS, using an adjusted read voltage. The adjusted read voltage is equal to the sum of the read voltage VB and an adjustment value L. The value of the adjusted read voltage VB can be determined in various ways. For example, the optimum read voltage for a cell transistor MT with the adjacent cell transistor MT at the C level is determined by simulation and/or experiments, and the difference between the original read voltage and the optimum one is calculated. This difference is used as the adjustment value L. The adjusted read voltage VB+Δ for the B level shifted by the adjacent cell transistors MT at the C level is also illustrated in FIG. 7. In this example, the adjustment value Δ usually has a positive value. This is because the threshold voltage of the read target cell transistor MT generally shifts in the positive direction by the adjacent cell transistor MT being at the C level.

Referring back to FIG. 8, an example as a result of the read with the adjusted read voltage is illustrated in the third row of FIG. 8. In this example, the result of the read with the read voltage VB, and that with the adjusted read voltage VB+Δ are different in some bits. One of the causes is a failure of correct determination of the shifted level B with the original read voltage VB used. The read data is stored in an unused data latch DL.

The sequencer 140 then selects, for each bit, one of the value read with the read voltage VB and the value read with the adjusted read voltage VB+Δ. The result of the selection is illustrated in the fourth row. The selection is based on whether the corresponding adjacent cell transistor MT for a bit is in the adjacent threshold state 1 or the adjacent threshold state 2. With the adjacent threshold state 1, the threshold voltage of the read target cell transistor MT may be shifted. For this reason, the sequencer 140 selects, for each bit, the value read with the adjusted read voltage VB+Δ if the result of the read from the adjacent cell transistor MT (the value in the first row) is "0". In the FIG. 8 example, the sequencer 140 selects the values read with the adjusted read voltage VB+Δ (values in the third row) for the fifth to eighth bits. In contrast, with the adjacent threshold state 2, it is considered that the threshold voltage of the read target cell transistor MT is not shifted so much as to cause an incorrect read at worst. Based on this, the sequencer 140 selects, for each bit, the value read with the read voltage VB if the result of the read from the adjacent cell transistor (the value in the first row) is "1". In the FIG. 8 example, the sequencer 140 selects the values read with the read voltage VB (values in the second row) for the first to fourth bits.

The sequencer 140 controls the data latches DL to read the values selected for respective bits to another unused data latch DL. The set of data items of bits read this way is treated as data of the read target page. Specifically, the sequencer 140 uses the data latch DL and the input and output circuit 120 to transmit the read data to the memory controller 200.

The read described above is represented by the flowchart of FIG. 9. FIG. 9 illustrates an example of a flow of the read in the memory device of the first embodiment.

When the memory device 100 receives an instruction for a read which leads to a read from the cell set CSx from the memory controller 200, the flow starts. Responding to receipt of the read instruction, the sequencer 140 determines the threshold state of each cell of the adjacent cell set. Steps for that correspond to step S1 to S3.

First, the sequencer 140 instructs the voltage generator 150 to generate the read voltage for determination of the threshold states (step S1). In the current context, the sequencer 140 instructs the voltage generator 150 to generate the read voltage VC.

The sequencer 140 uses the read voltage VC and controls the core driver 160, the row decoder 112, the data circuit and page buffer 113, and the column decoder 114, to read data from the adjacent cell set CSx+1 (step S2). The read data is stored in an unused data latch DL based on an instruction of the sequencer 140 (step S3).

The sequencer 140 then instructs the voltage generator 150 to generate the read voltage, such as the read voltage VB (step S11). The read with the read voltage VB corresponds to a read of a lower page. The sequencer 140 uses the read voltage VB and controls the core driver 160, the row decoder 112, the data circuit and page buffer 113, and the column decoder 114, to read data from the read target cell set CSx (step S12). The read data is stored in an unused data latch DL based on an instruction of the sequencer 140 (step S13).

Furthermore, the sequencer 140 orders the voltage generator 150 to generate the adjusted read voltage VB+Δ (step S14). The sequencer 140 uses the adjusted read voltage VB+Δ and controls the core driver 160, the row decoder 112, the data circuit and page buffer 113, and the column decoder 114, to read data from the read target cell set CSx (step S15). The read data is stored in an unused data latch DL based on an instruction of the sequencer 140 (step S16).

Lastly, the sequencer 140 selects read data for each bit of the read target cell set CSx (step S21). Specifically, the sequencer 140 controls the data latches DL to select data read in step S12 or S15 for each bit to combine the selected data to create the read data.

As described above, the Er level may be used instead of the C level for determination of the threshold state of adjacent cell set CS. In this case, the adjacent threshold state 1 is the Er level, and the adjacent threshold state 2 is the A, B, or C level. Moreover, the adjustment value n usually has a negative value. This is because an adjacent cell transistor of the Er level usually shifts the threshold voltage of the read target cell transistor MT in the negative direction.

As described, the memory device 100 of the first embodiment reads data from a particular cell transistor MT based on the state (level) of the cell transistor MT which shares the charge storage layer 29 with and adjoins that cell transistor MT. Specifically, when the memory device 100 receives an instruction for a read of data of a particular page, it determines the level of each cell transistor MT of the cell set CSx+1 which adjoins the cell set CSx storing the data of the read target page. The memory device 100 uses the original read voltage for a read of the read target page and the adjusted read voltage to read the read target page. Furthermore, the memory device 100 selects, for each bit, the value read with the original read voltage or the value read with the adjusted read voltage to create the read data based on the level of the cell transistors MT of the adjacent cell set CSx+1. For this reason, even if the cell transistors MT share the charge storage layer 29, influence by the adjacent cell transistors MT can be eliminated to generate more correct read data. Furthermore, the influence by the adjacent cell transistor MT is taken into consideration for each bit, and therefore the accuracy of read data is higher than in the case with the influence not considered.

Moreover, according to the first embodiment, each bit line BL is provided with plural latch units LU. For this reason, it is easy to compare data read in various cases, i.e., in a case of a read with the original read voltage and a case of a read with the adjusted read voltage. Specifically, data read with the original read voltage transistor MT and data read with the adjusted read voltage from a particular cell are stored in latch units LU coupled to the same bit line BL. For this reason, data to be compared is easily specified.

Second Embodiment

The second embodiment is based on the first embodiment. In the second embodiment, the states of the two adjacent cell transistors MT are determined and are determined more finely, and the read voltage used for a read from the cell transistors MT of the read target is also adjusted more finely.

FIG. 10 illustrates a block diagram of a memory device of the second embodiment. The memory device 100 of the second embodiment has the same functional blocks as those of the memory device 100 of the first embodiment. In addition, the memory device 100 of the second embodiment further includes a counter 170. The counter 170 is included in the sequencer 140, for example. FIG. 10 illustrates such an example.

Moreover, the memory device 100 of the second embodiment differs from that of the first embodiment in the operation of the sequencer 140, i.e., control by the sequencer 140.

Figure 11:
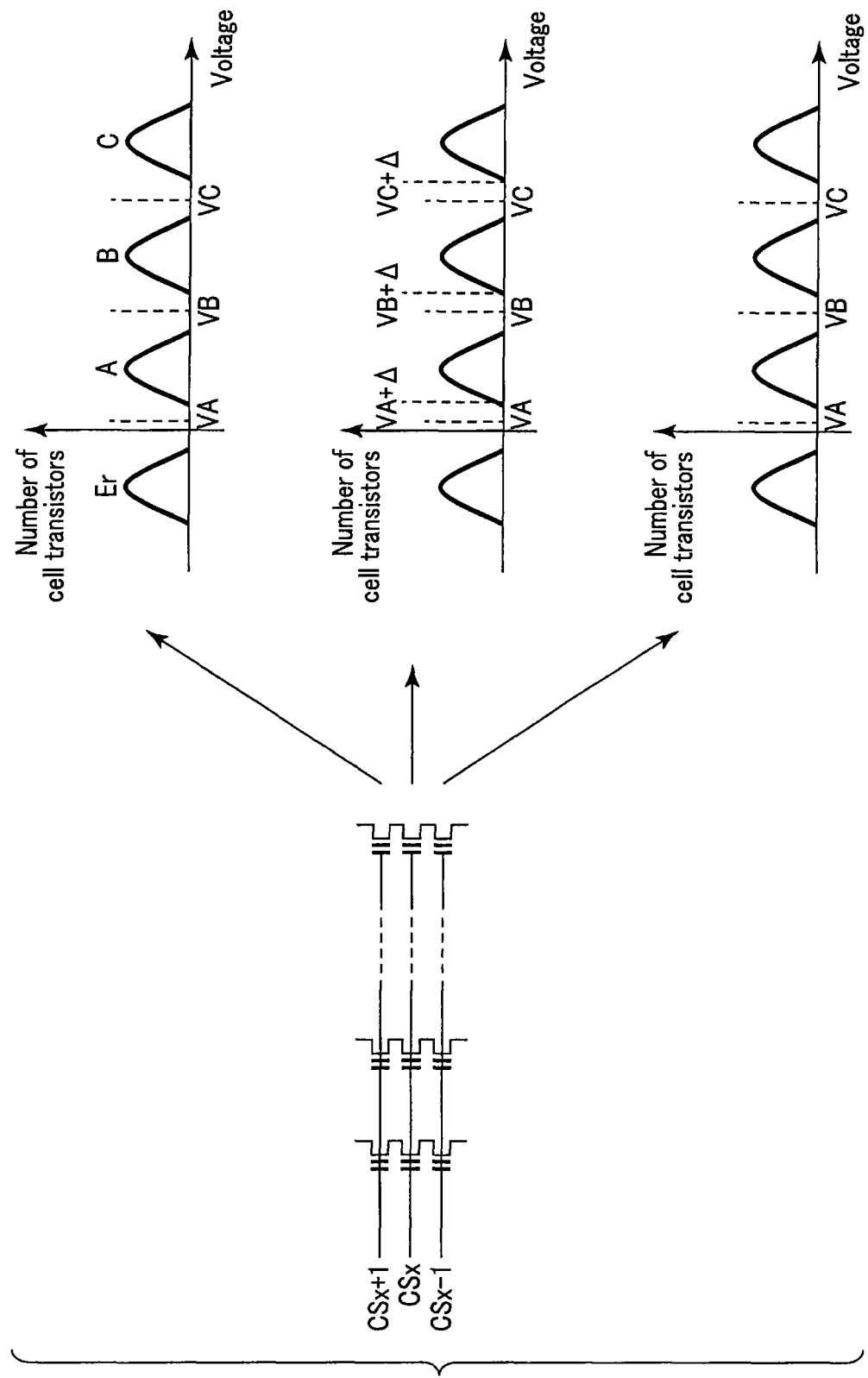
FIG. 11 illustrates an example of distributions of the threshold voltages of the cell transistors in the memory device of the second embodiment.

In the second embodiment, the states of adjacent cell sets CSx−1 and CSx+1 at both sides of the read target cell set CSx are determined as illustrated in FIG. 11. Specifically, the states of the two adjacent transistors MT at both sides of a read target cell transistor MT are determined. FIG. 11 illustrates an example of distributions of the threshold voltages of the cell transistors in the memory device of the second embodiment.

Moreover, the threshold voltage of the read target cell set CSx is influenced in various ways based on the level of the adjacent cell sets CSx−1 and CSx+1. Furthermore, it is considered that the influence in a case where one adjacent cell transistor MT has a particular level and the other adjacent cell transistor MT has another level is the same as that in a case where the two adjacent transistors MT have reversed levels. Based on such observation, combinations of the levels of both the adjacent cell transistors MT are classified as illustrated in FIG. 12 For a case of a transistor storing two bits per cell, a classification results in ten types of the combination as follows. FIG. 12 illustrates an example of the combinations of the adjacent threshold states in the memory device of the second embodiment and adjustment values for read voltages.

The adjacent threshold state 1 refers to a state where both the adjacent cell transistors MT are at the C level. The adjacent threshold state 2 refers to a state where one adjacent cell transistor MT is at the C level, and the other adjacent cell transistor MT is at the B level. The adjacent threshold state 3 refers to a state where one adjacent cell transistor MT is at the C level, and the other adjacent cell transistor MT is at the A level. The adjacent threshold state 4 refers to a state where one adjacent cell transistor MT is at the C level, and the other adjacent cell transistor MT is at the Er level. The adjacent threshold state 5 refers to a state where both the adjacent cell transistors MT are at the B level. The adjacent threshold state 6 refers to a state where one adjacent cell transistor MT is at the B level, and the other adjacent cell transistor MT is at the A level. The adjacent threshold state 7 refers to a state where one adjacent cell transistor MT is at the B level, and the other adjacent cell transistor MT is at the Er level. The adjacent threshold state 8 refers to a state where both the adjacent cell transistors MT are at the A level. The adjacent threshold state 9 refers to a state where one adjacent cell transistor MT is at the A level, and the other adjacent cell transistor MT is at the Er level. The adjacent threshold state 10 refers to a state where both the adjacent cell transistors MT are at the Er level.

For each adjacent threshold state, respective adjustment values for all the read levels are prepared. The read voltage VA for the A level read is added with one of the adjustment values $\Delta A1$ to $\Delta A10$. The adjustment values $\Delta 1$ to $\Delta 10$ are used in the adjacent threshold states 1 to 10, respectively.

Similarly, the read voltage VB for the B level read is added with one of the adjustment values $\Delta B1$ to $\Delta B10$. The adjustment values $\Delta B1$ to $\Delta B10$ are used in the adjacent threshold states 1 to 10, respectively. Furthermore, the read voltage VC for the C level read is added with one of the adjustment values $\Delta C1$ to $\Delta C10$. The adjustment values $\Delta C1$ to $\Delta C10$ are used in the adjacent threshold states 1 to 10, respectively. The adjustment values $\Delta A1$ to $\Delta A10$, $\Delta B1$ to $\Delta B10$, and $\Delta C1$ to $\Delta C10$ are stored in the memory device 100, for example, in the sequencer 140.

The way of obtaining the adjustment values is the same as that in the first embodiment. A adjustment value has a magnitude based on a combination of adjacent threshold states and levels, and is positive or negative. A adjustment value may be zero. For example, a adjustment value may be zero when all the read target cell transistors MT and the two adjacent cell transistors MT are at the same level. The read with the zero adjustment value is the same as a regular read, i.e., a read with an original read voltage.

Figure 13:
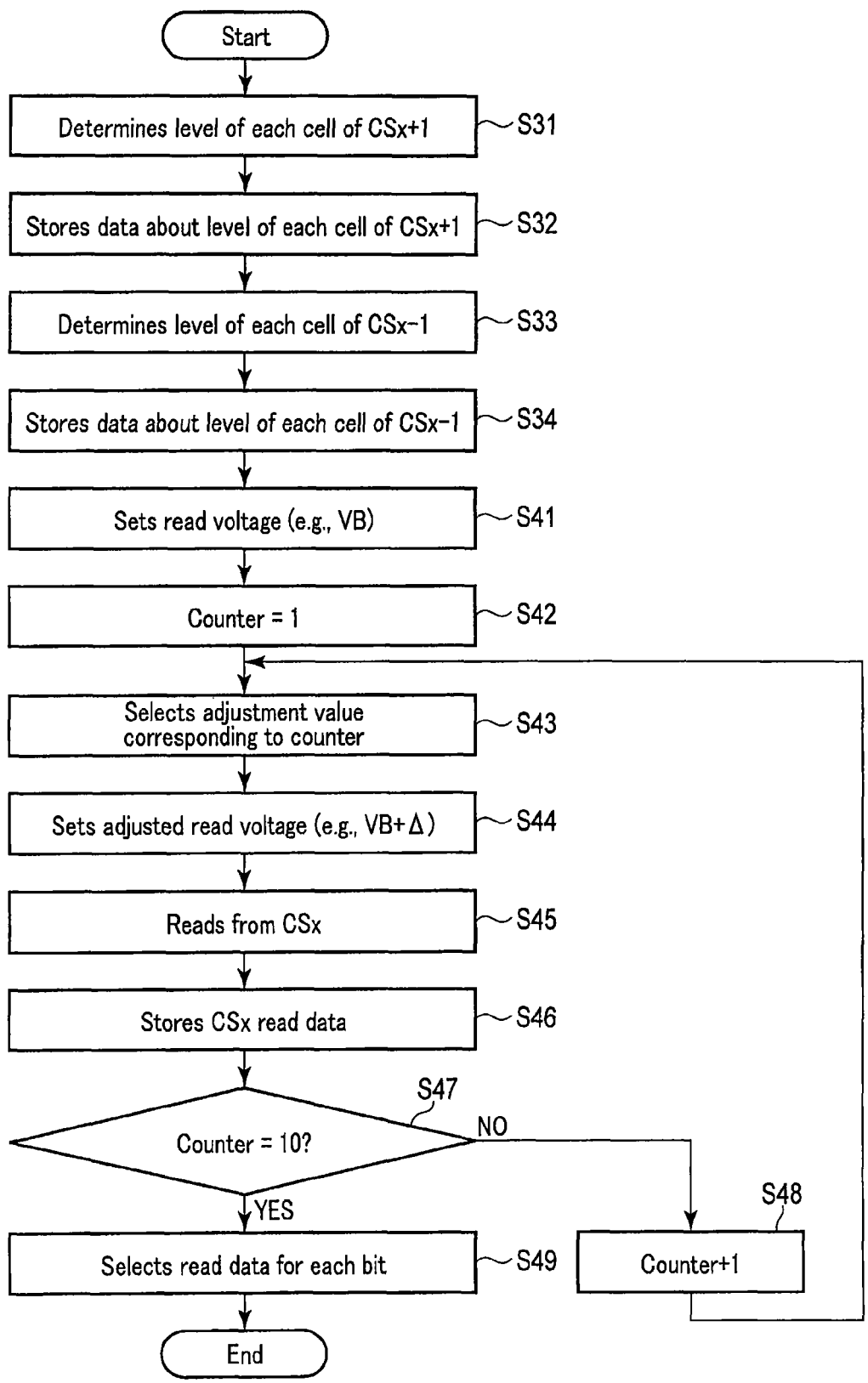
FIG. 13 illustrates an example of the flow of a read in the memory device of the second embodiment.
Figures 14, 15:
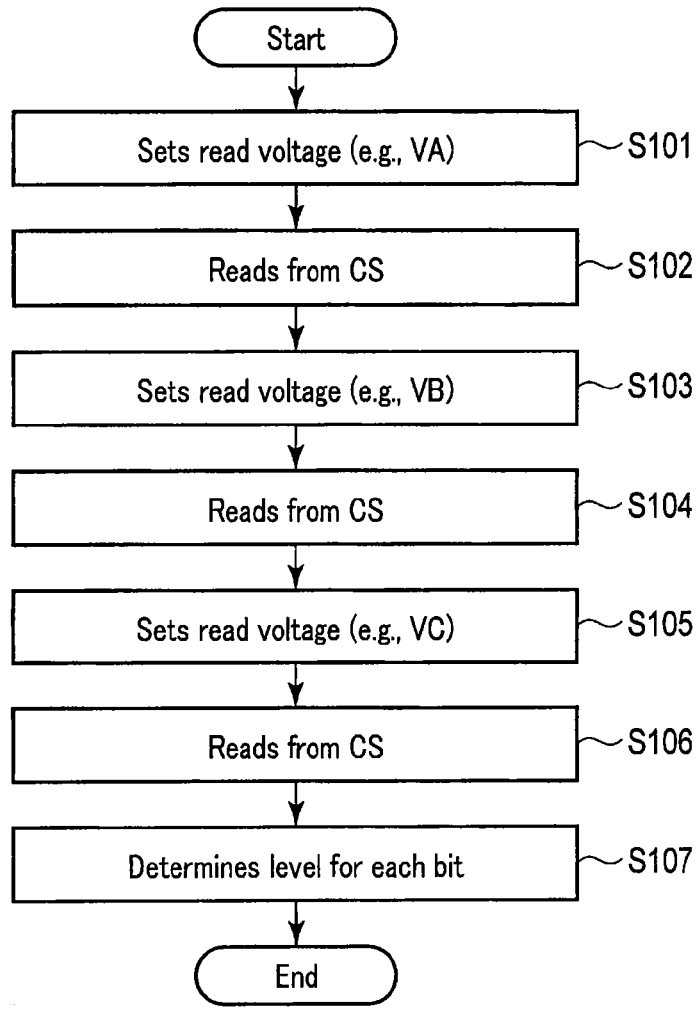
FIG. 14 illustrates an example of a sub-flow of a read in the memory device of the second embodiment.
FIG. 15 illustrates a relationship between the results of reads and levels in the memory device of the second embodiment.
Figure 16:
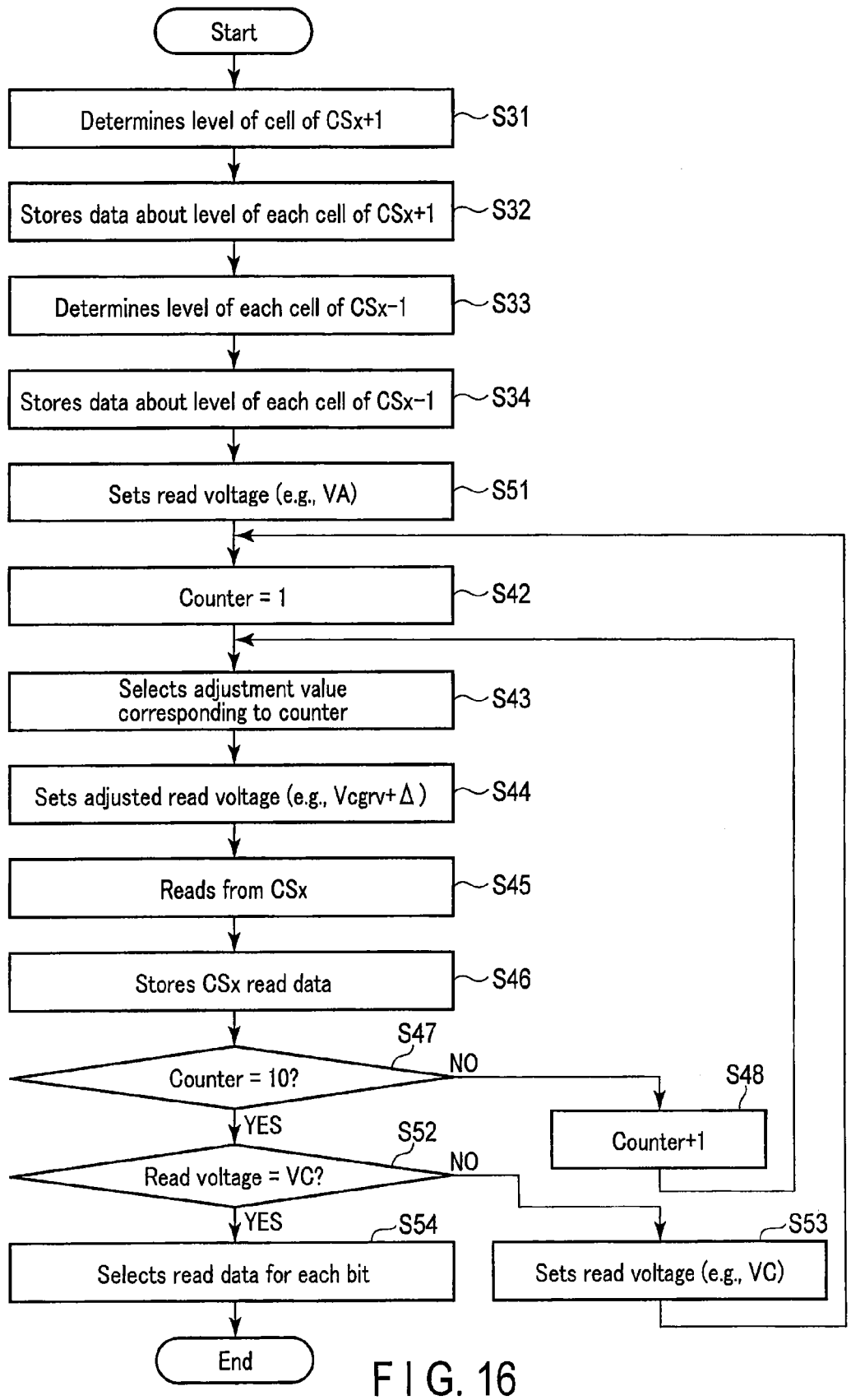
FIG. 16 illustrates a second example of the flow of another read in the memory device of the second embodiment.

Referring to FIGS. 13 to 16, a read of data in the memory device 100 will now be described. The memory device 100, in particular the sequencer 140, is configured to perform the operations described with reference to FIGS. 13 to 15. FIGS. 13 and 16 illustrate an example of a flow of the read in the memory device of the second embodiment. In particular, FIG. 13 illustrates an example of the flow of reading the lower page of a particular cell set, and FIG. 16 illustrates an example of the flow of reading the upper page of a particular cell set. FIG. 14 illustrates a sub-flow of FIGS. 13 and 16, and illustrates a flow of a particular step of FIGS. 13 and 16. FIG. 15 illustrates a relationship between the results of reads in the memory device of the second embodiment and levels.

When the memory device 100 receives an instruction for a read from the lower page of the set CSx of cells coupled to the word line WLx from the memory controller 200, the flow of FIG. 13 starts. Responding to receipt of the read instruction, the sequencer 140 determines the adjacent threshold states for adjacent cell sets CSx+1 and CSx−1. Steps for that correspond to step S31 to S34. Determination of any of the state of the adjacent cell sets CS may be performed first.

In step S31, the sequencer 140 determines the level for each cell transistor MT of, for example, the adjacent cell set CSx+1 (step S31). Step S31 can be performed by the sub-flow of FIG. 14. The selected cell set CSz in the FIG. 14 flow and the description on FIG. 14 corresponds to the adjacent cell set CSx+1 in step S31.

As illustrated in FIG. 14, the sequencer 140 instructs the voltage generator 150 to generate the read voltage VA (step S101). The sequencer 140 uses the read voltage VA and controls the core driver 160, the row decoder 112, the data circuit and page buffer 113, and the column decoder 114, to read data from the selected cell set CSz (step S102). As a result, "1" data is read from the cell transistors MT at the Er level of the selected cell set CSz, and "0" data is read from the cell transistors MT at the remaining A, B, or C level.

The sequencer 140 instructs the voltage generator 150 to generate the read voltage VB (step S103). The sequencer 140 uses the read voltage VB and controls the core driver 160, the row decoder 112, the data circuit and page buffer 113, and the column decoder 114, to read data from selected cell set CSz (step S104). As a result, "1" data is read from the cell transistors MT of the selected cell set CSz at Er or A level, and "0" data is read from the cell transistors MT at the remaining B or C level.

The sequencer 140 instructs the voltage generator 150 to generate the read voltage VC (step S105). The sequencer 140 uses the read voltage VC and control the core driver 160, the row decoder 112, the data circuit and page buffer 113, and the column decoder 114, to read data from the selected cell set CSz (step S106). As a result, "1" data is read from the cell transistors MT of the selected cell set CSz at Er, A, or B level, and "0" data is read from the cell transistors MT at the remaining C level.

The order of the read voltages used is not limited to the FIG. 14 example.

The sequencer 140 uses the result of steps S101 to S106 to determine the level of each cell transistor MT in the selected cell set CSz (step S107). Specifically, the cell transistor MT determined to store "1" data in all reads with the read voltage VA, VB, and VC is determined to be at the Er level as illustrated in FIG. 15. Similarly, the cell transistor MT from which "0" data was read with the read voltage VA and "1" data was read with the read voltages VB and VC are determined to be at the A level. Moreover, the cell transistor MT from which "0" data was read with the read voltages VA and VB and "1" data was read with the read voltage VC is determined to be at the B level. Lastly, the cell transistors MT from which "0" data was read in all the reads with the read voltages VA, VB, and VC are determined to be at the C level.

Referring back to FIG. 13, the sequencer 140 stores the data about the level of each transistor of the adjacent cell set CSx+1 determined in step S31 in an unused data latch DL (step S32).

The sequencer 140 then determines the level of each cell transistor MT of adjacent cell set CSx−1, for example (step S33). Step S33 can be performed by the sub-flow of FIG. 14. The read target cell set CSz in the FIG. 14 flow and the description on FIG. 14 correspond to the adjacent cell set CSx−1 in step S33.

The sequencer 140 stores the data about the level of each cell transistor MT of the adjacent cell set CSx−1 determined in step S33 in an unused data latch DL (step S34).

The sequencer 140 then uses respective adjustment values for all the adjacent threshold states one by one, to read data from the lower page of the read target cell set CSx. Steps for that correspond to steps S41 to S49. First, the sequencer 140 instructs the voltage generator 150 to generate the read voltage VB (step S41). The sequencer 140 then uses the current read voltage (read voltage VB) and adjustment values in respective adjacent threshold states for the current read voltage one by one to perform ten reads. An example of the method for that is described in the following. The following example is based on the ascending order of identification of the adjacent threshold states.

First, the sequencer 140 sets the value in the counter 170 to one (step S42). The value of the counter 170 is equal to the identification of the adjacent threshold state. The sequencer 140 selects the adjustment value corresponding to the value in the counter 170 and the current read voltage (step S43). For example, if the value in the counter 170 is one, the adjustment value $\Delta B1$ for the read voltage VB for the adjacent threshold state 1 is selected. The sequencer 140 instructs the voltage generator 150 to generate an adjusted read voltage (VB+$\Delta B1$) (step S44).

The sequencer 140 uses the adjusted read voltage and controls the core driver 160, the row decoder 112, the data circuit and page buffer 113, and the column decoder 114, to read data from the read target cell set CSx (step S45). The read data is stored in an unused data latch DL based on the instruction of the sequencer 140 (step S46).

The sequencer 140 determines whether the read for each of all the adjacent threshold states with the adjustment value has been performed. Specifically, in the current context, the sequencer 140 determines whether the value in the counter 170 is ten (step S47). When the determination in step S47 is No, the flow shifts to step S48. In step S48, the sequencer 140 increments the value in the counter 170 by one.

The step S48 continues as step S43. With the steps S43 to S46, a read with the adjustment value for the next adjacent threshold state is performed. The set of steps S43 to S48 is repeated until the determination in step S47 is Yes. As a result of repeating the set of steps S43 to S48 until the determination in step S47 is Yes, the set of data from the reads with all the adjustment values (adjustment values $\Delta B1$ to $\Delta B10$) is obtained. When the determination in step S47 is Yes, the flow shifts to step S49.

In step S49, the sequencer 140 selects read data for each bit in the read target page. Specifically, the sequencer 140 refers to the data about the level of adjacent cell sets CSx−1 and CSx+1 in the latches DL to determine the adjacent threshold state for each bit. The sequencer 140 then, for each bit, selects the data obtained with the adjustment value corresponding to the determined adjacent threshold state among all the adjustment values for the current level (adjustment values $\Delta B1$ to $\Delta B10$), and combines selected data to create the read data. The read data is transmitted to the memory controller 200 from the memory device 100 through the input and output circuit 120.

Referring to FIG. 16, a read from the upper page of the cell set CSx will now be described. When the memory device 100 receives an instruction for a read from the upper page of the cell set CSx from the memory controller 200, the flow of FIG. 16 starts.

First, steps S31 to S34 are performed. Step S34 continues at step S51. With step S51 and the subsequent steps, the sequencer 140 uses the respective adjustment values for all the adjacent threshold states one by one, to read data from the upper page of the read target cell set CSx. The read of the upper page includes determination of A or C level. Any determination can be performed first. The following description is based on the example where the determination of A level precedes.

First, the sequencer 140 instructs the voltage generator 150 to generate the read voltage VA in order to read the data of the upper page of the read target cell set CSx (step S51). Step S51 continues at step S42, and the set of steps S42 to S48 is repeated. Step S43 in the current context includes selection of one of the adjustment values $\Delta A1$ to $\Delta A10$, and step S44 includes use of the sum of the read voltage VA and one of the adjustment values $\Delta A1$ to $\Delta A10$. As a result of repeating the set of steps S43 to S48 until the determination in step S47 is Yes, the set of data read with all the adjustment values ΔA1 to ΔA10 is obtained. When the determination in step S47 is Yes, the flow shifts to step S52.

In step S52, the sequencer 140 determines whether the level under determination is, among two levels, the level different from the level for which the read voltage is set in step S51 (the C level in the current context. When the determination is No, the flow shifts to step S53. The sequencer 140 instructs the voltage generator 150 to generate the read voltage (the read voltage VC in the ongoing context) for the remaining one of the determination target levels for upper page read in order to read the data of the upper page of the read target cell set CSx in step S53. Step S53 continues at step S42, and the set of steps S42 to S48 is repeated. Step S43 in the ongoing context includes selection of one of the adjustment values ΔC1 to ΔC10, and step S44 includes use of the sum of the read voltage VC and one of the adjustment values ΔC1 to ΔC10. As a result of repeating the set of steps S43 to S48 until the determination in step S47 is Yes, the set of data read with all the adjustment values ΔC1 to ΔC10 is obtained. When the determination in step S47 is Yes, the flow shifts to step S54.

In step S54, the sequencer 140 selects read data for each bit in the read target page. Specifically, the sequencer 140 refers to the data about the level of adjacent cell sets CSx−1 and CSx+1 in the latches DL to determine the adjacent threshold state for each bit. The sequencer 140 then performs determination of A or C level for each bit (determination of "0" or "1" data). The sequencer 140 then, for each bit, selects the data obtained with the adjustment value corresponding to the determined adjacent threshold state among all the adjustment values for the determined level (adjustment values ΔA1 to ΔA10 or ΔC1 to ΔC10), and combines selected data to create the read data.]

In the description so far, the adjustment value is defined for each of all the combinations of the levels of both the adjacent cell transistors MT. Some combinations may be put together into one group, and one adjustment value may be prepared for each level for each group. For example, some of adjacent threshold states 1 to 10 are treated as one adjacent threshold state. For example, two or three of the adjacent threshold states 2 to 9 with adjacent identifications are put together into one group. The adjacent threshold states 1 and 10 are independent because their influences are great. Grouping of adjacent threshold states may be common to all the levels (A, B, and C levels), or independent of each level.

As described, the memory device 100 of the second embodiment reads data from a particular cell transistor MT based on the states (levels) of the cell transistors MT which share the charge storage layer 29 with and adjoins that cell transistor MT, as in the first embodiment. This can produce the same advantages as those of the first embodiment. Furthermore, in the second embodiment, a read is based on the combination of the states of both the cell transistors MT adjacent the read target cell transistor MT. For this reason, data can be read with much higher accuracy.

Moreover, plural latch units LU are provided for each bit line BL also in the second embodiment. For this reason, the data to be compared can be easily specified as in the first embodiment.

Third Embodiment

The third embodiment is based on the first or second embodiment.

In the third embodiment, adjustment values are further based on the positions of the word lines in addition to the first or second embodiment.

Figure 17:
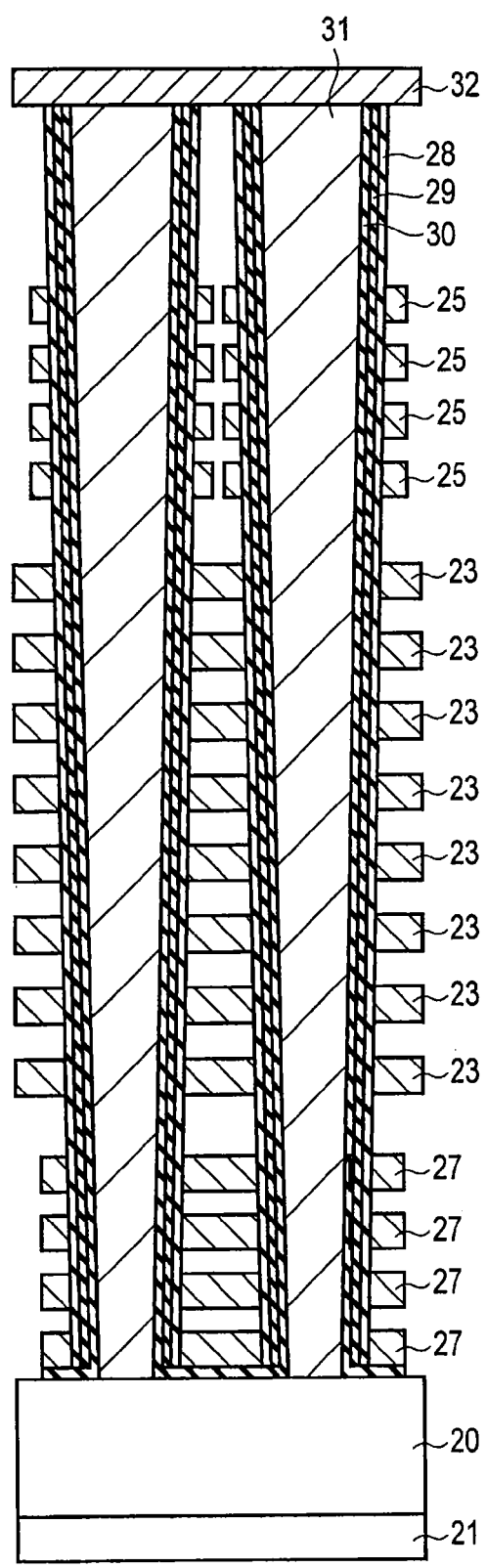
FIG. 17 illustrates a section of part of a cell array of a third embodiment.

Each semiconductor pillar 31 may have different diameters (or, the lengths of outer circumferences) based on its positions (or, heights or levels). For example, the semiconductor pillars 31 may have tapered forms as illustrated in FIG. 17. FIG. 17 illustrates a section of part of the cell array of the third embodiment. Specifically, each semiconductor pillar 31 has a smaller diameter in a position nearer to the substrate 21. Based on this, the block insulator 28, the charge storage layer 29, and the gate insulating layer 30 also have tapered forms, and therefore have smaller diameters in positions nearer to the substrate 21.

Assuming that the charge storage layer 29 has a substantially uniform thickness, part thereof with a smaller diameter has a smaller volume. For this reason, the charge storage layer 29 has a smaller volume in the part with the smaller diameter, and therefore stores a smaller amount of carriers. In contrast, the area of the charge storage layer 29 at the boundary of the cell transistors MT is proportional to the diameter of the charge storage layer 29. For this reason, in a section of the charge storage layer 29 with a smaller diameter, the probability that an electron and an electron hole meet is higher, i.e., combination of an electron and an electron hole easily occurs. Therefore, in a section of the charge storage layer 29 with a smaller diameter, there is a small amount of carriers which can be stored and combination of an electron and an electron hole easily occurs. In other words, in such a section, the amount of the electric charge easily varies.

Based on this, in the third embodiment, the amounts of amendments are smaller for upper cell sets CS, and are larger in lower layer cell sets CS. Specifically, for example, the area from the bottom word line WL to the top word line WL is divided into plural zones, and a adjustment value is adjusted based on the zones. The adjustment value Δ for a read from a cell set CS in a lower zone is larger, and the adjustment value Δ for a read from a cell set CS in an upper zone is smaller. Such an example is illustrated in FIG. 18. FIG. 18 illustrates an example of the combination of the adjacent threshold states and the adjustment values for read voltages in the memory device of the third embodiment.

FIG. 18 illustrates an example of the adjustment values Δ for a lower zone for a case of two zones being defined. The adjustment values Δ for the upper zone are the same as those in FIG. 12. The adjustment values Δ are equal to the sum of the values in FIG. 12 and α in a lower zone as illustrated in FIG. 18. α is a positive value. α for different adjustment values may be the same or different. The memory device 100 of the third embodiment, in particular the sequencer 140, specifies the read target cell set CS from the address of a read target page, and learns the address of the word line WL of the read target cell set CS from the read target cell set CS. From the address of the word line WL, the sequencer 140 then learns the zone to which that word line WL belongs. Furthermore, the sequencer 140 uses, among the adjustment values Δ of FIG. 12 and FIG. 18, those for the zone to which the read target cell set CS belongs, to read data.

The third embodiment is applicable to a case with three or more zones being defined by expansion of the principle described so far.

The semiconductor pillar 31 may have the variation in diameter based on the height differently from that in the tapered form. For example, a semiconductor pillar 31 may have, between the top and the bottom, a diameter (width) larger or smaller than that in another height. More specifically, a semiconductor pillar 31 may have a depression or bulge between the top and the bottom. Thus, there may be various types of the diameter variation according to the height in the semiconductor pillar 31. Also in such a case, cell sets CS with similar sizes of the diameters of the semiconductor pillar 31 are grouped together as one zone, and adjustment values Δ are used based on the size of the diameter of the semiconductor pillar 31 for each zone. In a zone with a larger diameter of the semiconductor pillar 31, smaller adjustment values Δ (for example, adjustment values Δ in FIG. 12) are used. In contrast, in a zone a with a smaller diameter of the semiconductor pillar 31, larger adjustment values Δ (for example, adjustment values Δ+α in FIG. 18) are used.

The description so far is based on an example where the third embodiment is applied to the second embodiment. The third embodiment, however, is also applicable to the first embodiment.

As described, the memory device 100 of the third embodiment reads data from a particular cell transistor MT based on the states (levels) of the cell transistors MT which share the charge storage layer 29 with and adjoins that cell transistor MT, as in the first or second embodiment. This can produce the same advantages as those of the first or second embodiment. Moreover, according to the third embodiment, the adjustment values Δ are based also on the positions (levels) of the cell sets CS. For this reason, the variation in change of the amount of electric charges in the charge storage layer 29 which differ based on the positions of cell sets CS can be alleviated to allow data to be read with a high accuracy.

Fourth Embodiment

The fourth embodiment relates to a memory controller. In the fourth embodiment, part of operation of the memory device 100 of the first, second, or the third embodiment is performed by the memory controller 200. In the fourth embodiment, the memory system 1 includes the same devices as the first embodiment (FIG. 1), although the memory controller 200 is configured to operate as described in the following. Specifically, when the processor 210 executes a program read from the ROM 220, for example, the operation of the memory controller 200 described in the following is implemented. In contrast, in the fourth embodiment, the memory device 100 can be a regular memory device which is not based on the first to third embodiments. Specifically, the memory device 100 only reads data from the address specified by the memory controller 200 of the fourth embodiment using the read voltage specified by the memory controller 200.

Figure 19:
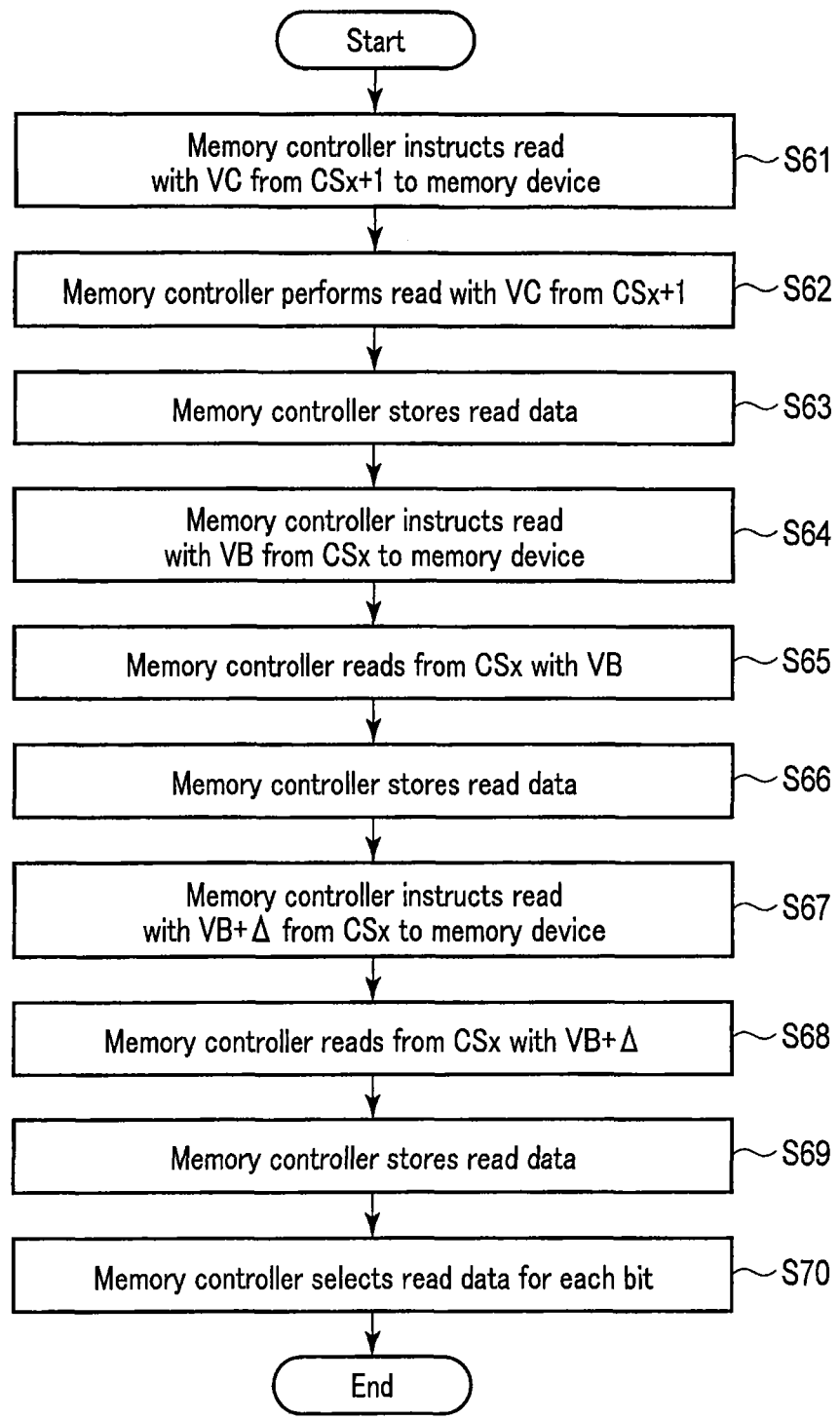
FIG. 19 illustrates a first example of the flow of a read from a memory device by a memory controller of a fourth embodiment.

FIG. 19 illustrates a first example of the flow of a read from the memory device by the memory controller of the fourth embodiment. FIG. 19 is based on the first embodiment, and is fundamentally similar to the flow of the first embodiment (FIG. 9) although components which perform some steps differ from those in the first embodiment. The following description is also based on the example on which the description of the first embodiment is based.

When the memory controller 200 receives an instruction for a read which leads to a read from the cell set CSx of the memory device 100 from the host device 300, the flow of FIG. 19 starts. Responding to receipt of the read instruction, the memory controller 200 instructs a read with the read voltage VC from the adjacent cell set CSx+1 to the memory device 100 (step S61). The operation by this instruction corresponds to part of the read of the data from the upper page of the cell set CSx+1. The sequencer 140 of the memory device 100 controls the voltage generator 150, the core driver 160, the row decoder 112, the data circuit and page buffer 113, and the column decoder 114, to perform the instructed read (step S62). The read data corresponds to the data obtained in step S2 of FIG. 9, and is transmitted from the memory device 100 to be received by the memory controller 200. The received data is stored in the RAM 230 (step S63).

The memory controller 200 instructs a read with the read voltage VB from the read target cell set CSx to the memory device 100 (step S64). The operation by this instruction corresponds to the read of the data from the lower page of the read target cell set CSx. When the memory device 100 receives the instruction, the sequencer 140 controls the voltage generator 150, the core driver 160, the row decoder 112, the data circuit and page buffer 113, and the column decoder 114, to perform the instructed read (step S65). The read data corresponds to the data obtained in step S11 of FIG. 9, and is transmitted from the memory device 100 to be received by the memory controller 200. The received data is stored in the RAM 230 (step S66).

The memory controller 200 further instructs a read with the adjusted read voltage VB+Δ from the read target cell set CSx to the memory device 100 (step S67). The sequencer 140 of the memory device 100 controls the voltage generator 150, the core driver 160, the row decoder 112, the data circuit and page buffer 113, and the column decoder 114, to perform the instructed read (step S68). The read data corresponds to the data obtained in step S14 of FIG. 9, and is transmitted from the memory device 100 to be received by the memory controller 200. The received data is stored in the RAM 230 (step S69).

Lastly, the memory controller 200 selects read data for each bit of the read target cell set CSx (step S70). The process performed in step S64 is the same as step S21 of FIG. 9. Specifically, for each bit, the memory controller 200 selects one of the data obtained in steps S61 to S69 and stored in the RAM 230, to combine the selected data to create read data.

Figure 20:
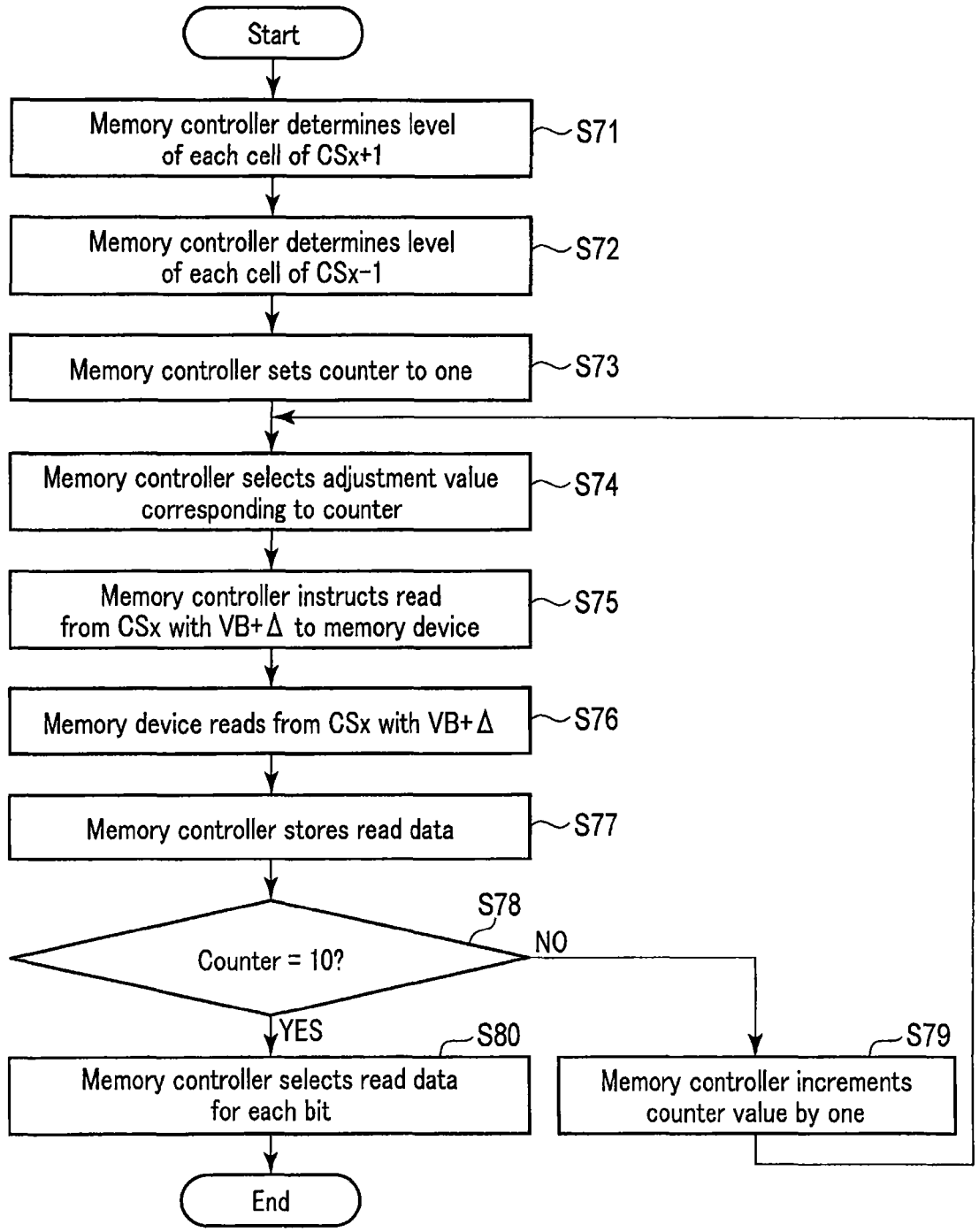
FIG. 20 illustrates a second example of the flow of a read from the memory device by the memory controller of the fourth embodiment.

FIG. 20 illustrates a second example of the flow of a read from the memory device by the memory controller of the fourth embodiment. FIG. 20 is based on the read from a lower page of the second embodiment, and is fundamentally similar to the flow of the second embodiment (FIG. 13) although components which perform some steps differ from those in the second embodiment. The following description is also based on the example on which the description of the second embodiment is based.

When the memory controller 200 receives an instruction for a read which leads to a read from the lower page of the cell set CSx of the memory device 100 from the host device 300, the flow of FIG. 20 starts. Responding to receipt of the read instruction, the memory controller 200 determines the adjacent threshold states for the adjacent cell sets CSx+1 and CSx−1. Steps for that correspond to step S71 to S74. The state of either of the adjacent cell sets CS may be determined first.

In step S71, the memory controller 200 determines the level for each cell transistor MT of the adjacent cell set CSx+1, for example. Step S71 can be performed by the subflow of FIG. 21. The selected cell set CS in FIG. 21 and the description on FIG. 21 corresponds to the adjacent cell set CSx+1 in step S71.

As illustrated in FIG. 21, The memory controller 200 instructs a read with the read voltage VA to the memory device 100 (step S201). When the memory device 100 receives the instruction, the sequencer 140 controls the voltage generator 150, the core driver 160, the row decoder 112, the data circuit and page buffer 113, and the column decoder 114, to read data from the selected cell set CSz (step S202). The process in step S202 is the same as step S102 of FIG. 14, and produces the same result as the data obtained in step S102. The obtained data is transmitted from the memory device 100, received by the memory controller 200, and stored in the RAM 230 (step S203).

Similarly, the memory controller 200 performs reads with the read voltages VB and VC. The details are the same as the read with the read voltage VA. Specifically, the memory controller 200 instructs a read with the read voltage VB to the memory device 100 (step S204), and the memory device 100 reads data from the read target cell set CS (step S205). The process in step S205 is the same as that in step S104 of FIG. 14, and produces the same result as the data obtained in step S104. The obtained data is stored in the RAM 230 (step S206). Furthermore, the memory controller 200 instructs a read with the read voltage VC to the memory device 100 (step S207), and the memory device 100 reads data from the read target cell set CS (step S208). The process in step S208 is the same as that in step S106 of FIG. 14, and produces the same result as the data obtained in step S106. The obtained data is stored in the RAM 230 (step S209).

Referring back to FIG. 20, the memory controller 200 determines the level for each cell of the adjacent cell set CSx−1, for example. Step S72 is the same as step S71 only with a difference of the target cell set CS, and can be performed by the subflow of FIG. 21. As a result of steps S71 and S72, the memory controller 200 learns which one of the adjacent threshold states 1 to 10 the adjacent threshold states are.

The memory controller 200 then uses the adjustment values for all the adjacent threshold states one by one to read data from the lower page of the read target cell set CSx. To this end, for example, the memory controller 200 performs reads based on the ascending order of the identifications of the adjacent threshold states as in the second embodiment (FIG. 13).

Figure 22:
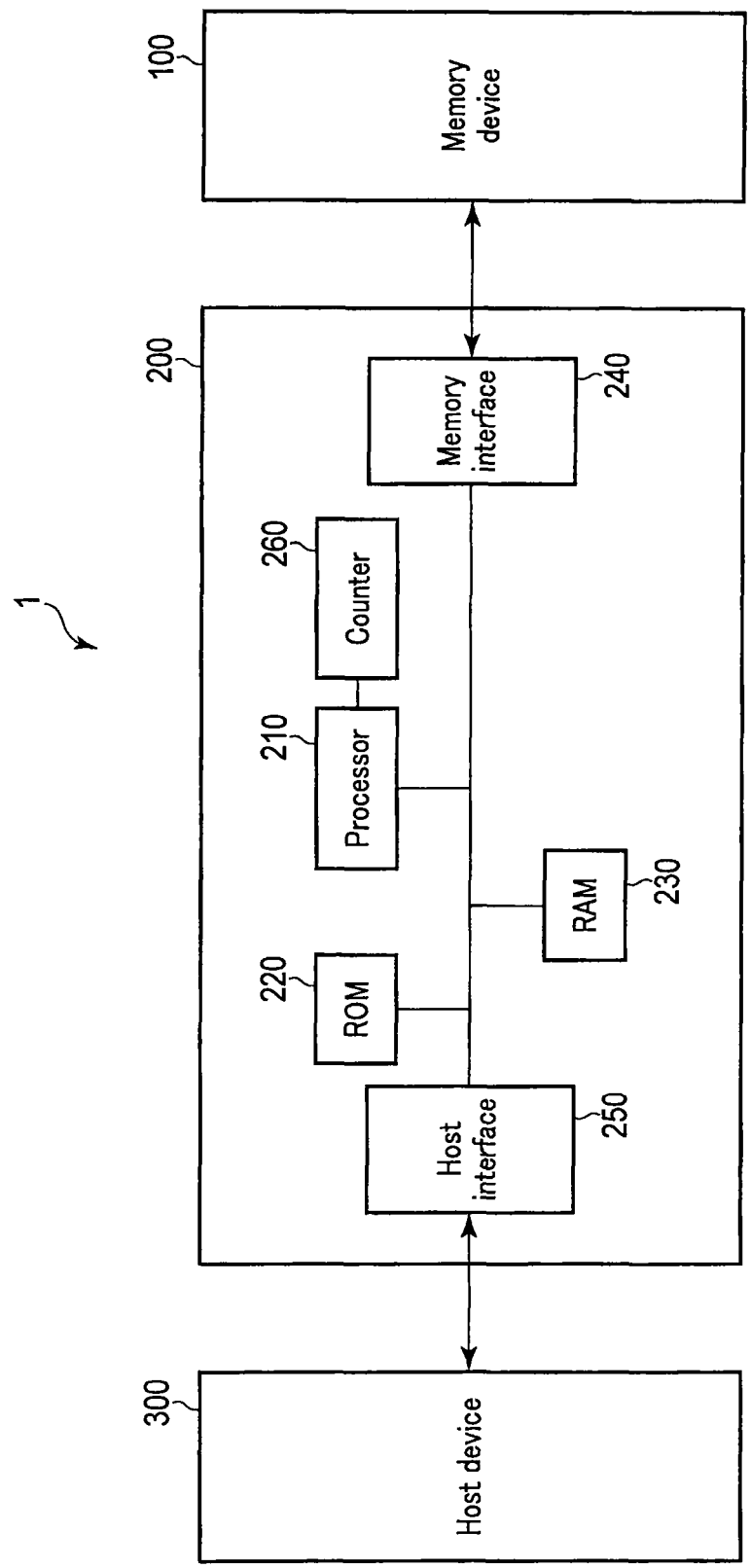
FIG. 22 illustrates a block diagram of a memory system of the fourth embodiment.

First, the memory controller 200 sets the value in the counter 260 as one (step S73). The counter 260 is provided in the memory controller 200, for example as illustrated in FIG. 22. The value in the counter 260 indicates the identification of the adjacent threshold state. The memory controller 200 uses the value in the counter 260 to select a adjustment value (step S74). Step S74 is the same as step S43 of FIG. 13.

The memory controller 200 then instructs a read with the adjusted read voltage (read voltage VB+ΔB1) according to the value in the counter 260 from the read target cell set CSx to the memory device 100 (step S75). When the memory device receives the instruction, it controls the voltage generator 150, the core driver 160, the row decoder 112, the data circuit and page buffer 113, and the column decoder 114, to read data from the read target cell set CSx (step S76). The process in step S76 is the same as that in step S45 of FIG. 13, and produces the same data as the data obtained in step S45. The obtained data is transmitted from the memory device 100, received by the memory controller 200, and stored in the RAM 230 (step S77).

The memory controller 200 determines whether the read with the adjusted read voltage for each of all the adjacent threshold states has been performed. Specifically, in the ongoing context, the memory controller 200 determines whether the value in the counter 260 is ten (step S78). If the determination in step S78 is No, the flow shifts to step S79. In step S79, the memory controller 260 increments the value in the counter 260 by one.

Step S79 continues at step S74. With steps S74 to S78, a read with the adjustment value for the next adjacent threshold state is performed. The set of steps S74 to S78 is repeated until the determination in step S78 is Yes. As a result of repeating the set of steps S74 to S78 until the determination in step S78 is Yes, the set of the read data with all the adjustment values (adjustment values ΔB1 to ΔB10) is obtained. When the determination in step S78 is Yes, the flow shifts to step S80.

In step S80, the memory controller 200 selects read data for each bit in the read target page. The process in step S80 is the same as that in step S49 of FIG. 13, and produces the same result as the process in step S49.

Figure 23:
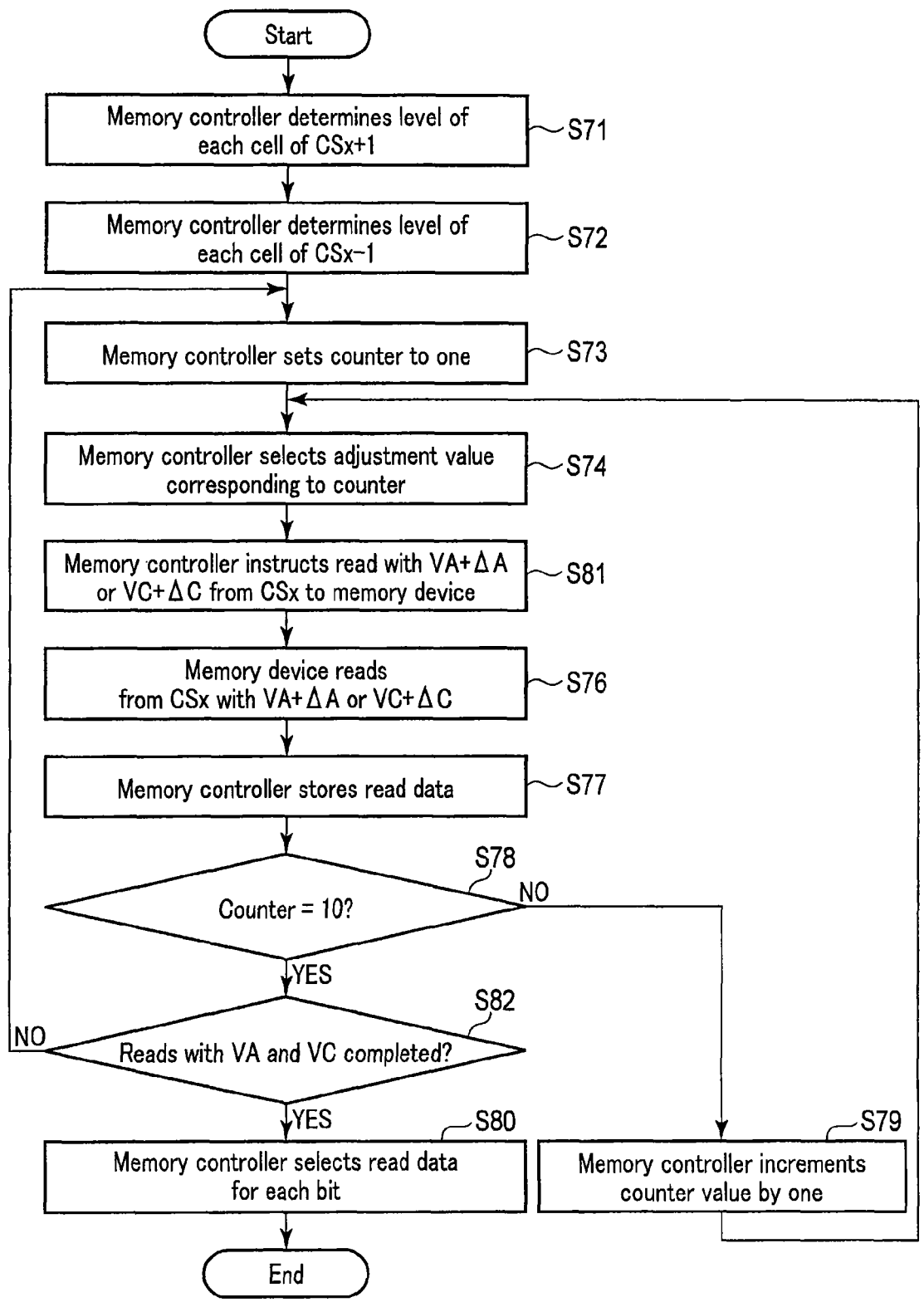
FIG. 23 illustrates a third example of the flow of a read from the memory device by the memory controller of the fourth embodiment.

FIG. 23 illustrates a third example of the flow of the read from the memory device by the memory controller of the fourth embodiment. FIG. 23 is based on the read from an upper page of the second embodiment, and is fundamentally similar to the second embodiment although components which perform some steps differ from those in the second embodiment. The following description is also based on the example on which the description of the second embodiment is based.

When the memory controller 200 receives an instruction for a read which leads to a read from the upper page of the cell set CSx of the memory device 100 from the host device 300, the flow of FIG. 20 starts.

First, steps S71 to S74 are performed. Step S74 continues at step S81. With step S81 and subsequent steps, the memory controller 200 uses the adjustment values for all the adjacent threshold states one by one, to read data from the upper page of the read target cell set CSx. The read of the upper page includes determination of A or C level. Either of the determinations may be performed first. The following description is based on the example where the determination of A level precedes.

First, the memory controller 200 instructs a read with the adjusted read voltage (read voltage VA+ΔA) according to the value in the counter 260 from the read target cell set CSx to the memory device 100 (step S81). Step S81 continues at step S76, and the set of steps S76 to S79 is repeated. Step S74 in the ongoing context includes selection of one of the adjustment values ΔA1 to ΔA10, and the step S81 includes use of the sum of the read voltage VA and one of the adjustment values ΔA1 to ΔA10. As a result of repeating the set of steps S74, S81, S76 to S79 until the determination in step S78 is Yes, the set of the read data with all the adjustment values ΔA1 to ΔA10 is obtained. When the determination in step S78 is Yes, the flow shifts to step S82.

In step S82, the sequencer 140 determines whether the reads for both the read voltages VA and VC have been completed. When this determination is No, the flow shifts to step S73. The memory controller 200 then repeats the set of steps S74 to S79 for the read voltage VC. Step S74 in the ongoing context includes selection of one of the adjustment values ΔC1 to ΔC10, and step S81 includes use of the sum of the read voltage VC and one of the adjustment values ΔC1 to ΔC10. As a result of repeating the set of steps S74, S81, S76 to S79 until the determination in step S78 is Yes, the set of the read data with all the adjustment values ΔC1 to ΔC10 is obtained. When the determinations in steps S78 and S82 are Yes, the flow shifts to step S80.

In step S80, the memory controller 200 selects read data for each bit in the read target page. The process in step S80 is the same as step S54 of FIG. 16, and produces the same result as the process in step S54. In this way, the memory controller 200 obtains the read data.

Also in the fourth embodiment, some of all the adjacent threshold states may be grouped, and one adjustment value may be prepared for each level for each group as described in the second embodiment. Furthermore, a adjustment value may be based also on the position (level) of a cell set CS as described in the third embodiment.

As described, according to the fourth embodiment, the memory controller 200 reads data of a particular cell transistor MT based on the states (levels) of the cell transistors MT which share the charge storage layer 29 with and adjoin that cell transistor MT, as in the first to third embodiments. For this reason, the same advantage as first to third embodiments can be obtained.

Fifth Embodiment

The fifth embodiment is based on the fourth embodiment.

Figure 24:
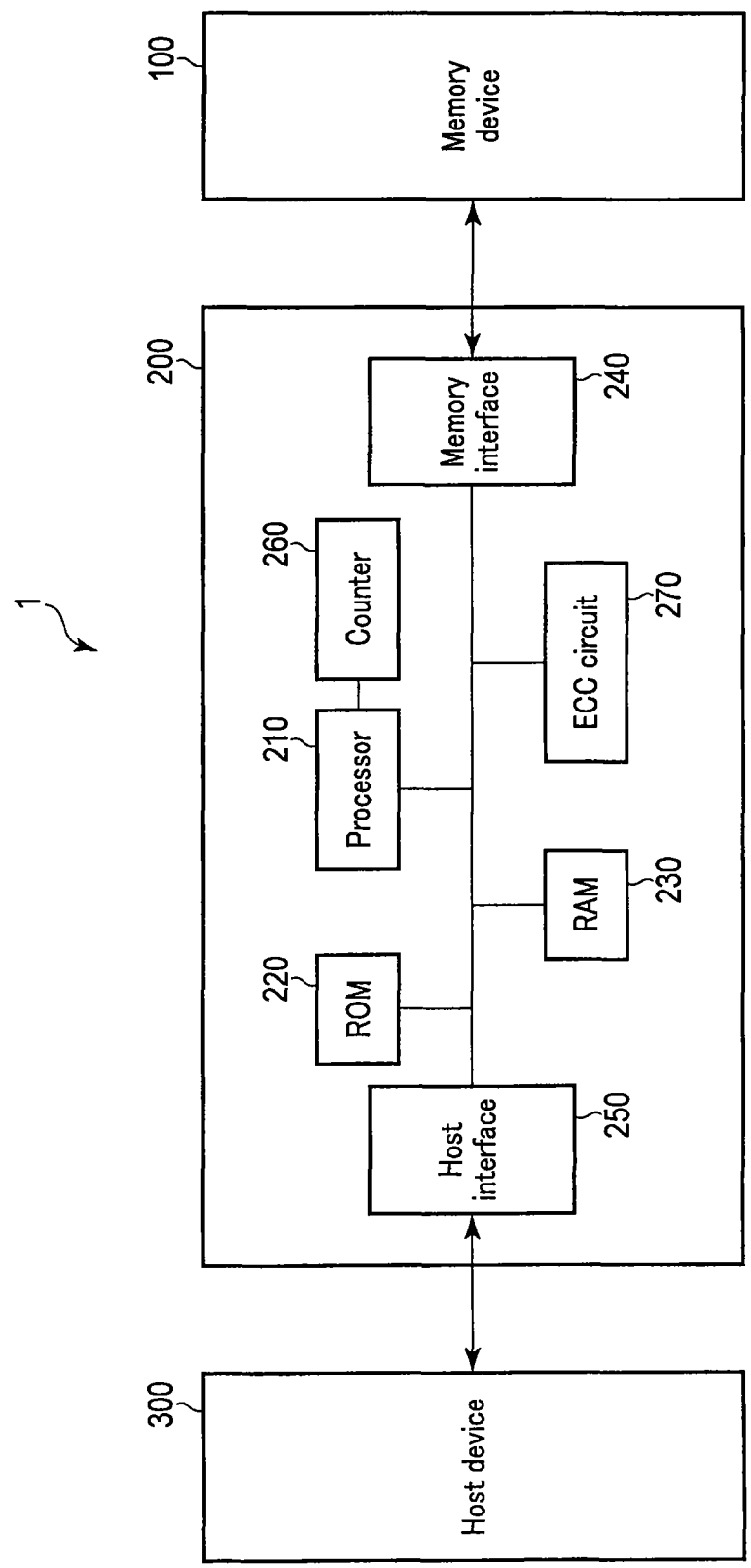
FIG. 24 illustrates a block diagram of a memory system of a fifth embodiment.

FIG. 24 illustrates a block diagram of the memory system of the fifth embodiment. The memory controller 200 further includes an error correction code (ECC) circuit 270 as illustrated in FIG. 24. The ECC circuit 270 generates, from received data, parity (error correction code) based on a predetermined rule for producing the error correction code, and outputs the set of the received data and the error correction code. The ECC circuit 270 also corrects errors of data based on received data and parity.

Figure 25:
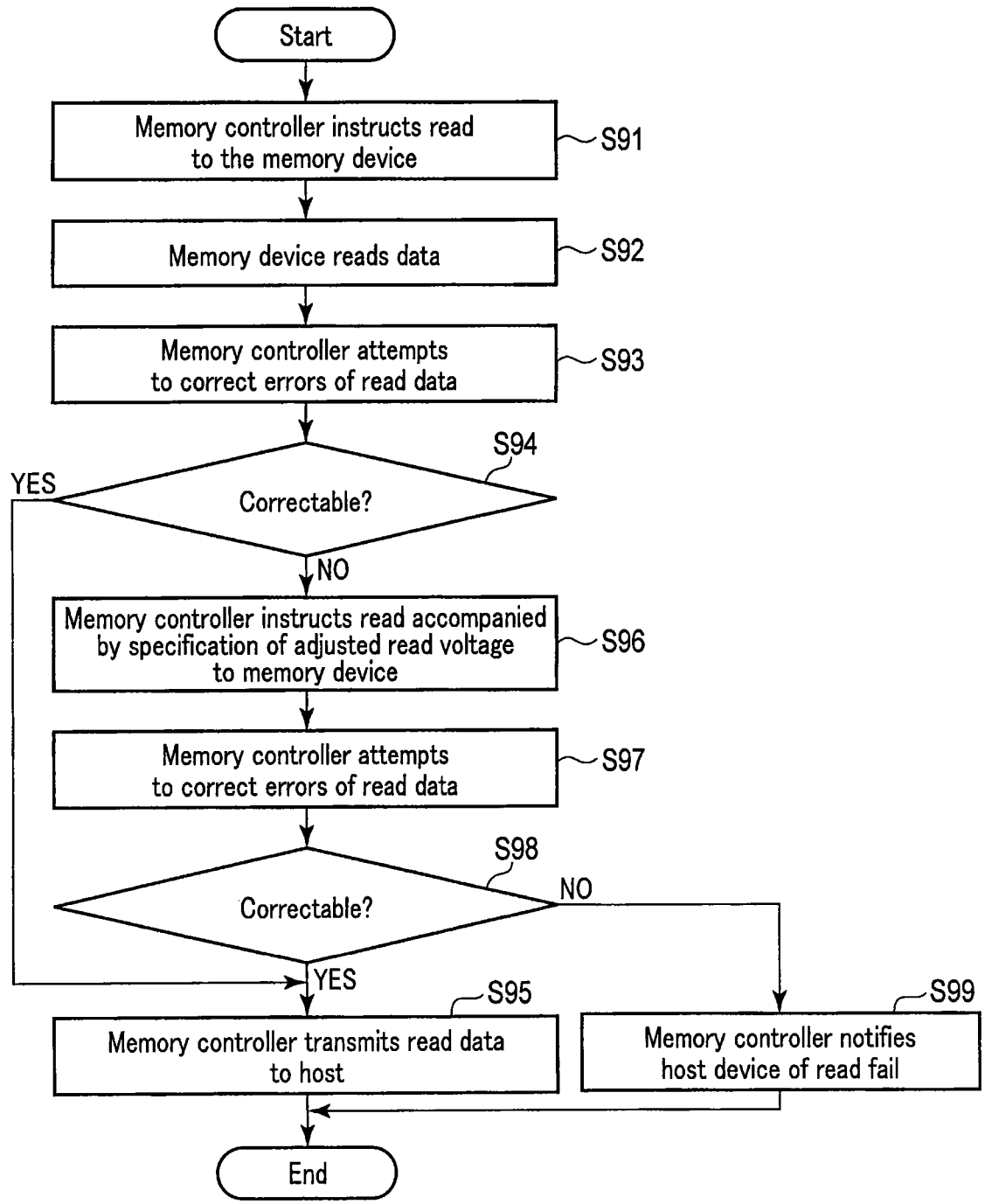
FIG. 25 illustrates an example of the flow of a read from a memory device by a memory controller of the fifth embodiment.

FIG. 25 illustrates an example of the flow of a read from the memory device by the memory controller of the fifth embodiment. The memory controller 200 is configured to perform the flow of FIG. 25. Specifically, when the processor 210 performs a program read from the ROM 220, for example, the operation of the memory controller 200 described in the following is implemented.

When the memory controller 200 receives an instruction for a read from the host device 300, the flow of FIG. 25 starts. When the memory controller 200 receives the instruction, it instructs a read from the page based on the instruction to the memory device 100 (step S91). The read here is a regular read, i.e., it does not include use of a adjusted read voltage. When the memory device 100 receives the instruction, the sequencer 140 controls the voltage generator 150, the core driver 160, the row decoder 112, the data circuit and page buffer 113, and the column decoder 114, to read data from the instructed page (step S92). The read data is received by the memory controller 200.

The memory controller 200 attempts to correct errors of the received data using the ECC circuit 270 (step S93). When the errors of data can be corrected by the ECC circuit 270, the ECC circuit 270 outputs the read data with the errors corrected. In contrast, when the errors cannot be corrected, the ECC circuit 270 outputs a signal which indicates that the errors cannot be correctable. The memory controller 200 (processor 210) uses the output from the ECC circuit 270 to determine whether the errors can be corrected (step S94). When the errors can be corrected, the processor 210 transmits the error-corrected read data to the host device 300 (step S95), and the flow ends.

In contrast, when determined that the errors cannot be corrected in step S94, the flow shifts to step S96. In step S96, the memory controller 200 instructs a read accompanied by specification of a read voltage (adjusted read voltage) to the memory device 100. The process in step S96 is the same as the read in the fourth embodiment. As step S96, the read of the first example of the fourth embodiment (FIG. 19) is performed, for example. Alternatively, as step S96, the read of the second example of the fourth embodiment (FIG. 20) is performed for a case of the read from the lower page from the read target cell set CS, and the read of the third example of the fourth embodiment (FIG. 23) is performed for a case of the read from the upper page from the read target cell set CS.

The read data obtained in step S96 is received by the memory controller 200. The memory controller 200 attempts to correct the errors of the received data using the ECC circuit 270 (step S97). The memory controller 200 uses the contents of the output from the ECC circuit 270 to determine whether the errors can be corrected (step S98). When the errors can be corrected, the flow shifts to step S95, otherwise, the flow shifts to step S99. In step S99, the memory controller 200 notifies the host device 300 that the instructed read failed, and the flow ends.

As described, according to the fifth embodiment, the memory controller 200 firsts performs a regular read (with an original read voltage), and when errors of the data obtained through the original read are uncorrectable, the memory controller 200 reads data of a particular cell transistor MT based on the states (levels) of the cell transistors MT which share the charge storage layer 29 with and adjoin that cell transistor MT similarly to the fourth embodiment as in the first to third embodiments. This can produce the same advantages as the fourth embodiment. Furthermore, when the errors of data obtained through a regular read cannot be corrected, the memory controller 200 of the fifth embodiment performs a read using an adjusted read voltage. For this reason, the amount of the processing done by the memory controller 200 can be reduced. Specifically, according to the fifth embodiment, reads of high accuracy can be implemented with a reduced amount of processing.

(Modification)

The description so far is based on the storage of two bits per cell transistor. Each embodiment, however, can be based on the storage of one or three or more bits per cell transistor. Furthermore, each embodiment is applicable to memory devices and/or memory controllers storing plural bits per cell transistor which are different from those described above.

Moreover, a read per cell set CS is not necessary. For example, for one or more cell transistors MT in a cell set CS, the determination of the levels of one or two adjacent cell transistors MT, the read with the original and adjusted read voltages, and the selection of data may be performed.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device, comprising:
   a memory cell array in which data is written per page unit and data is erased per block, the block being a multiple of the page unit of a natural number of two or more, and comprising memory strings, each of the memory strings comprising memory cells configured to store data of one or more bits with a plurality of threshold voltages, the plurality of threshold voltages being a threshold voltage indicative of an erase state in which data is erased and one or more threshold voltages that are higher than the voltage indicative of the erase state and indicate written states in which data is written; and a controller configured to:
select one of adjustment values of positive and negative values based on a combination of first read data read from a first memory cell of the memory cells, second read data read from a third memory cell of the memory cells, and a read voltage,
read data from a second memory cell of the memory cells using the selected adjustment value and the read voltage,
select a first adjustment value as the adjustment value when the read voltage is a first voltage, and
select a second adjustment value as the adjustment value when the read voltage is a second voltage, wherein
the first voltage corresponds to a first threshold voltage of the plurality of threshold voltages,
the second voltage corresponds to a second threshold voltage of the plurality of threshold voltages and is different from the first threshold voltage, and
the second adjustment value is different from the first adjustment value.

2. The device of claim 1, wherein the first and second memory cells adjoin, and the third memory cell adjoins the second memory cell at a side opposite the first memory cell.

3. The device of claim 2, wherein
each of the first to third memory cells comprises a first layer,
the threshold voltage of the first memory cell is based on an amount of electric charge in the first layer of the first memory cell,
the threshold voltage of the second memory cell is based on an amount of electric charge in the first layer of the second memory cell, and
the threshold voltage of the third memory cell is based on an amount of electric charge in the first layer of the third memory cell.

4. The device of claim 3, wherein the first layer of the first memory cell, the first layer of the second memory cell, and the first layer of the third memory cell are continuous.

5. The device of claim 1, wherein the controller reads data from the second memory cell using a sum of an adjustment value based on a combination of a value of data read from the first memory cell and a value of data read from the third memory cell and the read voltage.

6. The device of claim 1, wherein the controller is further configured to:
store adjustment values each of which corresponds to a case where the first memory cell stores data of a value and data read from the third memory cell stores data of a value,
read, using a sum of each of the adjustment values and the read voltage, data from the second memory cell for each of cases of the adjustment values, and
select, among data read for each of cases of the adjustment values, data based on a combination of the value of data read from the first memory cell and the value of data read from the third memory cell.

7. The memory device of claim 1, wherein
the second memory cell is located at a level from a substrate, and the adjustment values are further based on the level of the second memory cell.

8. The device of claim 7, wherein
the second memory cell is located below a predetermined height,
the controller is further configured to read data using a third adjustment value as the adjustment value when the read voltage corresponds to the first threshold voltage, and
the third adjustment value is larger than the first adjustment value.

9. The device of claim 7, wherein
the first, second, and third memory cells are positioned at respective different levels from the substrate, and
a semiconductor pillar has respective different diameters at respective positions corresponding to the first, second, and third memory cells.

10. The device of claim 9, wherein
a semiconductor pillar has, at a position corresponding to the second memory cell, a diameter smaller than a predetermined value,
the controller is further configured to read data from the second memory cell using a fourth adjustment value as the adjustment value, and
the fourth adjustment value is larger than the first adjustment value.

11. The device of claim 1, wherein
when each of the first read data, the second read data, and the read voltage corresponds to the same threshold voltage, the adjustment value is zero, and
the controller is further configured to read data from the second memory cell using the read voltage.

12. The device of claim 11, wherein
each of the first read data, the second read data, and the read voltage corresponds to one of the one or more threshold voltages included in the plurality of threshold voltages.

13. The device of claim 1, wherein
each of the adjustment values corresponds to each of a plurality of combination patterns of data of the first memory cell and data of the third memory cell, and
the controller is further configured to:
read each of a plurality of third read data items from the second memory cell using each of a plurality of first adjustment values and the read voltage, each of the plurality of third read data items corresponding to each of the plurality of first adjustment values, each of the plurality of first adjustment values corresponding to each of a plurality of combination patterns of data of the first memory cell and data of the third memory cell,
select one of the plurality of combination patterns based on the first read data and the second read data, and
select one of the plurality of third read data items corresponding to the selected combination pattern as data of the second memory cell.

14. The device of claim 13, wherein
when each of the memory cells is configured to store data of two bits with four threshold voltages, a number of the plurality of combination patterns is ten.

15. The device of claim 13, further comprising a data latch, wherein
the controller is further configured to store the plurality of third read data items, and to select one of the plurality of third read data items stored in the data latch as data of the second memory cell.

16. A method of reading data from a memory cell array in which data is written per page unit and data is erased per block which is a multiple of the page unit of a natural number of two or more, the block comprising memory strings, each of the memory strings comprising memory cells capable of storing data of one or more bits with a plurality of threshold voltages, the plurality of threshold voltage being a threshold voltage indicative of an erase state in which data is erased and one or more threshold voltages which are higher than the voltage indicative of the erase state and indicate written states in which data is written, the method comprising:

selecting one of adjustment values of positive and negative values based on a combination of first read data read from a first memory cell of the memory cells, second read data read from a third memory cell of the memory cells, and a read voltage; and reading data from a second memory cell of the memory cells using the selected adjustment value and the read voltage, wherein a first adjustment value is selected as the adjustment value when the read voltage is a first voltage, a second adjustment value is selected as the adjustment value when the read voltage is a second voltage, the first voltage corresponds to a first threshold voltage of the plurality of threshold voltages, the second voltage corresponds to a second threshold voltage of the plurality of threshold voltages and is different from the first threshold voltage, and the second adjustment value is different from the first adjustment value.

17. The method of claim 16, wherein the first and second memory cells adjoin, and the third memory cell adjoins the second memory cell at a side opposite the first memory cell.

18. The method of claim 17, wherein each of the first to third memory cells comprises a first layer, the threshold voltage of the first memory cell is based on an amount of electric charge in the first layer of the first memory cell, the threshold voltage of the second memory cell is based on an amount of electric charge in the first layer of the second memory cell, and the threshold voltage of the third memory cell is based on an amount of electric charge in the first layer of the third memory cell.

19. The method of claim 18, wherein the first layer of the first memory cell, the first layer of the second memory cell, and the first layer of the third memory cell are continuous.

20. The method of claim 16, wherein the reading of data comprises reading data from the second memory cell using a sum of an adjustment value based on a combination of a value of data read from the first memory cell and a value of data read from the third memory cell and the read voltage.

* * * * *